US012748170B2

(12) United States Patent
Wen et al.

(10) Patent No.: US 12,748,170 B2
(45) Date of Patent: *Sep. 29, 2026

(54) SYSTEMS AND METHODS FOR MAGNETIC RESONANCE IMAGING

(71) Applicant: SHANGHAI UNITED IMAGING HEALTHCARE CO., LTD., Shanghai (CN)

(72) Inventors: Linfei Wen, Shanghai (CN); Zhenhua Shen, Shanghai (CN)

(73) Assignee: SHANGHAI UNITED IMAGING HEALTHCARE CO., LTD., Shanghai (CN)

( * ) Notice: Subject to any disclaimer, the term of this patent is extended or adjusted under 35 U.S.C. 154(b) by 224 days.

This patent is subject to a terminal disclaimer.

(21) Appl. No.: 18/413,008

(22) Filed: Jan. 15, 2024

(65) Prior Publication Data

US 2024/0241200 A1 Jul. 18, 2024

Related U.S. Application Data

(63) Continuation-in-part of application No. 17/662,835, filed on May 10, 2022, now Pat. No. 11,874,354.

(30) Foreign Application Priority Data

May 13, 2021 (CN) ......................... 202110524587.6
Jun. 18, 2021 (CN) ......................... 202110678025.7

(51) Int. Cl.
*G01R 33/54* (2006.01)

(52) U.S. Cl.
CPC ................................. *G01R 33/543* (2013.01)

(58) Field of Classification Search
CPC ............................ G01R 33/543; G01R 33/288
See application file for complete search history.

(56) References Cited

U.S. PATENT DOCUMENTS 5,304,928 A 4/1994 Takeda
10,473,742 B2 * 11/2019 Choi .................. G01R 33/5616
(Continued)

FOREIGN PATENT DOCUMENTS

CN 101612042 A 12/2009
CN 102288929 A 12/2011
(Continued)

OTHER PUBLICATIONS

The Extended European Search Report in European Application No. 22173066.6 mailed on Oct. 10, 2022, 10 pages.
(Continued)

*Primary Examiner* — G. M. A Hyder
(74) *Attorney, Agent, or Firm* — METIS IP LLC

(57) ABSTRACT

Systems and methods for MRI are provided. The methods may include for each slice of a plurality of slices of a subject to be scanned, determining a plurality of radiofrequency (RF) parameters, the plurality of RF parameters including at least one channel parameter corresponding to each of a plurality of channels; determining a slice group based at least in part on the RF parameters corresponding to the plurality of slices, the slice group including at least two slices selected from the plurality of slices; and directing at least a portion of the plurality of channels to excite the slice group based on RF parameters corresponding to the slice group.

20 Claims, 26 Drawing Sheets

(56) References Cited

U.S. PATENT DOCUMENTS

| | | | | |
|---|---|---|---|---|
| 11,874,354 | B2 * | 1/2024 | Wen | G01R 33/546 |
| 2005/0124866 | A1 | 6/2005 | Elaz et al. | |
| 2007/0273377 | A1 | 11/2007 | Yang et al. | |
| 2010/0308819 | A1 | 12/2010 | Umeda et al. | |
| 2012/0313645 | A1 | 12/2012 | Biber et al. | |
| 2012/0319686 | A1 | 12/2012 | Jesmanowicz et al. | |
| 2013/0342200 | A1 | 12/2013 | Ugurbil | |
| 2015/0362574 | A1 | 12/2015 | Wu et al. | |
| 2016/0220128 | A1 | 8/2016 | Den Brinker et al. | |

FOREIGN PATENT DOCUMENTS

| | | | |
|---|---|---|---|
| CN | 105137375 | A | 12/2015 |
| CN | 106373458 | A | 2/2017 |
| CN | 108172284 | A | 6/2018 |
| CN | 211791529 | U | 10/2020 |
| CN | 112806982 | A | 5/2021 |
| JP | H0779941 | A | 3/1995 |

OTHER PUBLICATIONS

First Office Action in Chinese Application No. 202110524587.6 mailed on Sep. 2, 2022, 11 pages.

* cited by examiner

1500

1800

SYSTEMS AND METHODS FOR MAGNETIC RESONANCE IMAGING

CROSS-REFERENCE TO RELATED APPLICATIONS

This application is continuation-in-part of U.S. application Ser. No. 17/662,835, filed on May 10, 2022, which claims priority to Chinese Application No. 202110678025.7, filed on Jun. 18, 2021, and Chinese Application No. 202110524587.6, filed on May 13, 2021, the contents of each of which are incorporated herein by reference in their entirety.

TECHNICAL FIELD

This disclosure generally relates to medical imaging, and more particularly, relates to systems and methods for magnetic resonance imaging (MRI).

BACKGROUND

MRI is a widely used medical imaging technique that uses a magnetic field and radiofrequency (RF) signals to acquire information of anatomy and physiological information of a patient body. For MRI systems using a high magnetic field, spatial inhomogeneity becomes a key factor that significantly affects the imaging quality, which is related to the inhomogeneity of the emission field distribution. To improve the spatial inhomogeneity, some MRI systems use multiple channels for exciting multiple slices of a subject one by one, which may lead to relatively low imaging efficiency. Therefore, it is desirable to provide improved MRI systems and methods for improving imaging efficiency and imaging quality.

SUMMARY

According to an aspect of the present disclosure, a method for controlling magnetic resonance imaging (MRI) is provided. The method may be implemented on a machine having at least one processing device and at least one storage device. The method may include, for each slice of a plurality of slices of a subject to be scanned, determining a plurality of radiofrequency (RF) parameters, the plurality of RF parameters including at least one channel parameter corresponding to each of a plurality of channels. The method may further include determining a slice group based at least in part on the RF parameters corresponding to the plurality of slices. The slice group may include at least two slices selected from the plurality of slices. The method may further include directing at least a portion of the plurality of channels to excite the slice group based on RF parameters corresponding to the slice group.

In some embodiments, for each slice of the plurality of slices of the subject to be scanned, the determining the plurality of RF parameters may include determining the plurality of RF parameters of the slice based on a set of sensitivity parameters corresponding to the plurality of channels respectively with respect to the slice.

In some embodiments, the at least one channel parameter corresponding to each of the plurality of channels may include an excitation power of the channel for exciting the slice. The determining a slice group based at least in part on the RF parameters corresponding to the plurality of slices may include determining the slice group based at least in part on the excitation powers of the plurality of channels for exciting the plurality of slices.

In some embodiments, the determining the slice group based at least in part on the excitation powers of the plurality of channels for exciting the plurality of slices may include selecting a first slice to be excited from the plurality of slices; for each of the plurality of channels, determining a power difference between a power threshold of the channel and an excitation power of the channel for exciting the first slice; determining at least one first candidate slice based on the power difference corresponding to at least one of the plurality of channels; and determining the slice group based on the first slice and the at least one first candidate slice.

In some embodiments, two or more slices of the slice group may be excited at the same time by one channel of the plurality of channels.

In some embodiments, the determining the slice group based at least in part on the excitation powers of the plurality of channels for exciting the plurality of slices may include: determining a second slice to be excited from the plurality of slices; determining a first total excitation power of the plurality of channels for exciting the second slice; determining whether the first total excitation power exceeds a total power threshold; in response to determining that the first total excitation power exceeds the total power threshold, determining at least one second candidate slice based on the excitation power of each channel of the plurality of channels for exciting each slice of the plurality of slices, wherein a second total excitation power of the plurality of channels for concurrently exciting the second slice and the at least one second candidate slice is less than or equal to the total power threshold; and determining the slice group based on the second slice and the at least one second candidate slice.

In some embodiments, the at least one channel parameter corresponding to each of the plurality of channels may include a specific absorption ratio (SAR) when exciting the slice. The determining a slice group based at least in part on the RF parameters corresponding to the plurality of slices may include determining the slice group based at least in part on the SARs corresponding to the plurality of channels for exciting the plurality of slices.

In some embodiments, the method may further include directing a terminal device to present output data related to at least a part of the channel parameters corresponding to the plurality of channels.

In some embodiments, the directing a terminal device to present output data related to at least a part of the channel parameters corresponding to the plurality of channels may include: for two or more of the plurality of channels, directing the terminal device to concurrently present output data related to corresponding channel parameters.

In some embodiments, the directing the terminal device to present output data related to at least a part of the channel parameters may include directing the terminal device to present one or more marks and output data related to at least one channel parameter corresponding to one of the plurality of channels, wherein the one or more marks are used to provide an unfold option for presenting output data related to at least one channel parameter corresponding to at least one of other channels.

In some embodiments, the method may further include: in response to receiving an export request for exporting at least one channel parameter corresponding to at least one of the plurality of channels via the terminal device, exporting the corresponding at least one channel parameter based on the export request.

In some embodiments, the method may further include: in response to receiving an update request for updating one or more of the channel parameters corresponding to the plurality of channels via the terminal device, updating the one or more channel parameters based on the update request.

In some embodiments, the method may further include verifying one or more of the channel parameters corresponding to the plurality of channels based on one or more reference datasets.

According to another aspect of the present disclosure, a system is provided. The system may include at least one storage device including a set of instructions; and at least one processor in communication with the at least one storage device. When executing the set of instructions, the at least one processor is directed to perform operations including: for each slice of a plurality of slices of a subject to be scanned, determining a plurality of radiofrequency (RF) parameters, the plurality of RF parameters including at least one channel parameter corresponding to each of a plurality of channels; determining a slice group based at least in part on the RF parameters corresponding to the plurality of slices, the slice group including at least two slices selected from the plurality of slices; and directing at least a portion of the plurality of channels to excite the slice group based on RF parameters corresponding to the slice group.

According to yet another aspect of the present disclosure, a non-transitory computer readable medium is provided. The non-transitory computer readable medium may include at least one set of instructions. When executed by one or more processors of a computing device, the at least one set of instructions causes the computing device to perform a method. The method may include, for each slice of a plurality of slices of a subject to be scanned, determining a plurality of radiofrequency (RF) parameters, the plurality of RF parameters including at least one channel parameter corresponding to each of a plurality of channels; determining a slice group based at least in part on the RF parameters corresponding to the plurality of slices, the slice group including at least two slices selected from the plurality of slices; and performing an imaging scan on the subject by at least exciting the slice group based on RF parameters corresponding to the slice group.

Additional features will be set forth in part in the description which follows, and in part will become apparent to those skilled in the art upon examination of the following and the accompanying drawings or may be learned by production or operation of the examples. The features of the present disclosure may be realized and attained by practice or use of various aspects of the methodologies, instrumentalities and combinations set forth in the detailed examples discussed below.

BRIEF DESCRIPTION OF THE DRAWINGS

The present disclosure is further described in terms of exemplary embodiments. These exemplary embodiments are described in detail with reference to the drawings. The drawings are not to scale. These embodiments are non-limiting exemplary embodiments, in which like reference numerals represent similar structures throughout the several views of the drawings, and wherein.

DETAILED DESCRIPTION

Figure 1:
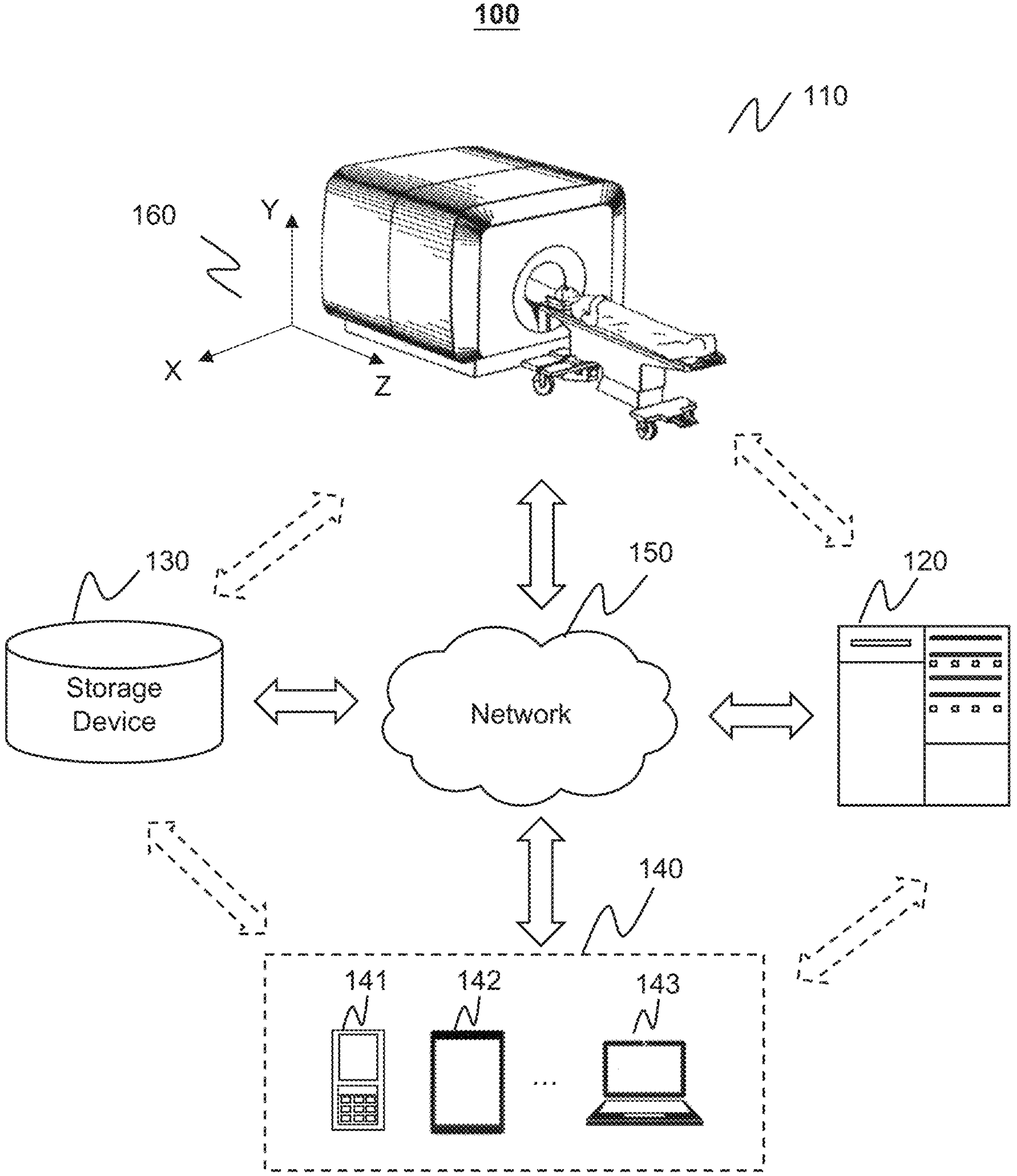
FIG. 1 is a schematic diagram illustrating an exemplary MRI system according to some embodiments of the present disclosure.

In the following detailed description, numerous specific details are set forth by way of examples in order to provide a thorough understanding of the relevant disclosure. However, it should be apparent to those skilled in the art that the present disclosure may be practiced without such details. In other instances, well-known methods, procedures, systems, components, and/or circuitry have been described at a relatively high-level, without detail, in order to avoid unnecessarily obscuring aspects of the present disclosure. Various modifications to the disclosed embodiments will be readily apparent to those skilled in the art, and the general principles defined herein may be applied to other embodiments and applications without departing from the spirit and scope of the present disclosure. Thus, the present disclosure is not limited to the embodiments shown, but to be accorded the widest scope consistent with the claims.

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. As used herein, the terms "and/or" and "at least one of" include any and all combinations of one or more of the associated listed items. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof. Also, the term "exemplary" is intended to refer to an example or illustration.

It will be understood that the terms "system," "engine," "unit," "module," and/or "block" used herein are one method to distinguish different components, elements, parts, sections or assembly of different levels in ascending order. However, the terms may be displaced by another expression if they achieve the same purpose.

Generally, the word "module," "unit," or "block," as used herein, refers to logic embodied in hardware or firmware, or to a collection of software instructions. A module, a unit, or a block described herein may be implemented as software and/or hardware and may be stored in any type of non-transitory computer-readable medium or another storage device. In some embodiments, a software module/unit/block may be compiled and linked into an executable program. It will be appreciated that software modules can be callable from other modules/units/blocks or from themselves, and/or may be invoked in response to detected events or interrupts. Software modules/units/blocks configured for execution on computing devices may be provided on a computer-readable medium, such as a compact disc, a digital video disc, a flash drive, a magnetic disc, or any other tangible medium, or as a digital download (and can be originally stored in a compressed or installable format that needs installation, decompression, or decryption prior to execution). Such software code may be stored, partially or fully, on a storage device of the executing computing device, for execution by the computing device. Software instructions may be embedded in firmware, such as an EPROM. It will be further appreciated that hardware modules/units/blocks may be included in connected logic components, such as gates and flip-flops, and/or can be included of programmable units, such as programmable gate arrays or processors. The modules/units/blocks or computing device functionality described herein may be implemented as software modules/units/blocks, but may be represented in hardware or firmware. In general, the modules/units/blocks described herein refer to logical modules/units/blocks that may be combined with other modules/units/blocks or divided into sub-modules/sub-units/sub-blocks despite their physical organization or storage. The description may be applicable to a system, an engine, or a portion thereof.

It will be understood that, although the terms "first," "second," "third," etc., may be used herein to describe various elements, these elements should not be limited by these terms. These terms are only used to distinguish one element from another. For example, a first element could be termed a second element, and, similarly, a second element could be termed a first element, without departing from the scope of exemplary embodiments of the present disclosure.

The term "pixel" and "voxel" in the present disclosure are used interchangeably to refer to an element in an image. The term "image" in the present disclosure is used to refer to images of various forms, including a 2-dimensional image, a 3-dimensional image, a 4-dimensional image, etc.

Spatial and functional relationships between elements are described using various terms, including "connected," "attached," and "mounted." Unless explicitly described as being "direct," when a relationship between first and second elements is described in the present disclosure, that relationship includes a direct relationship where no other intervening elements are present between the first and second elements, and also an indirect relationship where one or more intervening elements are present (either spatially or functionally) between the first and second elements. In contrast, when an element is referred to as being "directly" connected, attached, or positioned to another element, there are no intervening elements present. Other words used to describe the relationship between elements should be interpreted in a like fashion (e.g., "between," versus "directly between," "adjacent," versus "directly adjacent," etc.).

These and other features, and characteristics of the present disclosure, as well as the methods of operation and functions of the related elements of structure and the combination of parts and economies of manufacture, may become more apparent upon consideration of the following description with reference to the accompanying drawings, all of which form a part of this disclosure. It is to be expressly understood, however, that the drawings are for the purpose of illustration and description only and are not intended to limit the scope of the present disclosure. It is understood that the drawings are not to scale.

The flowcharts used in the present disclosure illustrate operations that systems implement according to some embodiments of the present disclosure. It is to be expressly understood the operations of the flowcharts may be implemented not in order. Conversely, the operations may be implemented in inverted order, or simultaneously. Moreover, one or more other operations may be added to the flowcharts. One or more operations may be removed from the flowcharts.

Provided herein are systems and components for controlling MRI. Exemplary MRI systems may include a superconducting magnetic resonance imaging system, a non-superconducting magnetic resonance imaging system, etc. The multi-modality imaging system may include, for example, a computed tomography-magnetic resonance imaging (MRI-CT) system, a positron emission tomography-magnetic resonance imaging (PET-MRI) system, a single photon emission computed tomography-magnetic resonance imaging (SPECT-MRI) system, a digital subtraction angiography-magnetic resonance imaging (DSA-MRI) system, etc.

FIG. 1 is a schematic diagram illustrating an exemplary MRI system according to some embodiments of the present disclosure. As illustrated, an MRI system 100 may include an MRI scanner 110, a processing device 120, a storage device 130, a terminal device 140, and a network 150. The components of the MRI system 100 may be connected in one or more of various ways. Merely by way of example, as illustrated in FIG. 1, the MRI scanner 110 may be connected to the processing device 120 directly as indicated by the bi-directional arrow in dotted lines linking the MRI scanner 110 and the processing device 120, or through the network 150. As another example, the storage device 130 may be connected to the MRI scanner 110 directly as indicated by the bi-directional arrow in dotted lines linking the MRI scanner 110 and the storage device 130, or through the network 150. As still another example, the terminal device 140 may be connected to the processing device 120 directly as indicated by the bi-directional arrow in dotted lines linking the terminal device 140 and the processing device 120, or through the network 150.

The MRI scanner 110 may be configured to scan a subject (or a part of the subject) to acquire image data, such as echo signals (also referred to as magnetic resonance (MR) data or MR signals) associated with the subject. For example, the MRI scanner 110 may detect a plurality of echo signals by applying an MRI pulse sequence on the subject. In some embodiments, the MRI scanner 110 may include, for example, a main magnet, a gradient coil (or also referred to as a spatial encoding coil), a radio frequency (RF) coil, etc. In some embodiments, the MRI scanner 110 may be a permanent magnet MRI scanner, a superconducting electromagnet MRI scanner, a resistive electromagnet MRI scanner, etc., according to types of the main magnet. In some embodiments, the MRI scanner 110 may be a high-field MRI scanner, a mid-field MRI scanner, a low-field MRI scanner, etc., according to the intensity of the magnetic field.

In some embodiments, the MRI scanner 110 may be equipped with a plurality of channels. Each of the plurality of channels may be configured to emit RF signals based on at least one channel parameter corresponding to the channel. In some embodiments, each of the plurality of channels may be configured to excite one slice in a single excitation. In some embodiments, at least one channel of the plurality of channels may be configured to excite two or more slices concurrently. In some embodiments, each of the plurality of channels may be controlled independently. In some embodiments, channel parameters of the plurality of channels may be the same or different.

For illustration purposes, a coordinate system 160 including an X-axis, a Y-axis, and a Z-axis is provided in FIG. 1. The X-axis and the Z axis shown in FIG. 1 may be horizontal, and the Y-axis may be vertical. As illustrated, the positive X direction along the X-axis may be from the right side to the left side of the MRI scanner 110 seen from the direction facing the front of the MRI scanner 110; the positive Y direction along the Y-axis shown in FIG. 1 may be from the lower part to the upper part of the MRI scanner 110; the positive Z direction along the Z-axis shown in FIG. 1 may be a direction in which the subject is moved out of a detection region (or referred to as a bore) of the MRI scanner 110.

The processing device 120 may process data and/or information obtained from the MRI scanner 110, the storage device 130, and/or the terminal device 140. In some embodiments, for each of a plurality of slices to be scanned, the processing device 120 may determine a plurality of RF parameters. The plurality of RF parameters may include at least one channel parameter corresponding to each of the plurality of channels. The processing device 120 may determine a slice group based at least in part on the RF parameters corresponding to the plurality of slices. The slice group may include at least two slices selected from the plurality of slices. The processing device 120 may further direct at least a portion of the plurality of channels to excite the slice group based on RF parameters corresponding to the slice group.

In some embodiments, the processing device 120 may be a single server or a server group. The server group may be centralized or distributed. In some embodiments, the processing device 120 may be local or remote. For example, the processing device 120 may access information and/or data from the MRI scanner 110, the storage device 130, and/or the terminal device 140 via the network 150. As another example, the processing device 120 may be directly connected to the MRI scanner 110, the terminal device 140, and/or the storage device 130 to access information and/or data. In some embodiments, the processing device 120 may be implemented on a cloud platform. For example, the cloud platform may include a private cloud, a public cloud, a hybrid cloud, a community cloud, a distributed cloud, an inter-cloud, a multi-cloud, or the like, or a combination thereof. In some embodiments, the processing device 120 may be part of the terminal device 140. In some embodiments, the processing device 120 may be part of the MRI scanner 110.

The storage device 130 may store data, instructions, and/or any other information. In some embodiments, the storage device 130 may store data obtained from the MRI scanner 110, the processing device 120, and/or the terminal device 140. The data may include image data acquired by the processing device 120, algorithms and/or models for processing the image data, etc. For example, the storage device 130 may store imaging signals obtained from an MRI scanner (e.g., the MRI scanner 110). As another example, the storage device 130 may store information of a coil sensitivity of each of a plurality of coils. In some embodiments, the storage device 130 may store data and/or instructions that the processing device 120 and/or the terminal device 140 may execute or use to perform exemplary methods described in the present disclosure.

In some embodiments, the storage device 130 may include a mass storage, removable storage, a volatile read-and-write memory, a read-only memory (ROM), or the like, or any combination thereof. Exemplary mass storage may include a magnetic disk, an optical disk, a solid-state drive, etc. Exemplary removable storage may include a flash drive, a floppy disk, an optical disk, a memory card, a zip disk, a magnetic tape, etc. Exemplary volatile read-and-write memories may include a random-access memory (RAM). Exemplary RAM may include a dynamic RAM (DRAM), a double date rate synchronous dynamic RAM (DDR SDRAM), a static RAM (SRAM), a thyristor RAM (T-RAM), and a zero-capacitor RAM (Z-RAM), etc. Exemplary ROM may include a mask ROM (MROM), a programmable ROM (PROM), an erasable programmable ROM (EPROM), an electrically erasable programmable ROM (EEPROM), a compact disk ROM (CD-ROM), and a digital versatile disk ROM, etc. In some embodiments, the storage device 130 may be implemented on a cloud platform. Merely by way of example, the cloud platform may include a private cloud, a public cloud, a hybrid cloud, a community cloud, a distributed cloud, an inter-cloud, a multi-cloud, or the like, or any combination thereof.

In some embodiments, the storage device 130 may be connected to the network 150 to communicate with one or more other components (e.g., the processing device 120, the terminal device 140) of the MRI system 100. One or more components of the MRI system 100 may access the data or instructions stored in the storage device 130 via the network 150. In some embodiments, the storage device 130 may be integrated into the MRI scanner 110 or the processing device 120.

The terminal device 140 may be connected to and/or communicate with the MRI scanner 110, the processing device 120, and/or the storage device 130. In some embodiments, the terminal device 140 may include a mobile device 141, a tablet computer 142, a laptop computer 143, or the like, or any combination thereof. For example, the mobile device 141 may include a mobile phone, a personal digital assistant (PDA), a gaming device, a navigation device, a point of sale (POS) device, a laptop, a tablet computer, a desktop, or the like, or any combination thereof. In some embodiments, the terminal device 140 may include an input device, an output device, etc. The input device may include alphanumeric and other keys that may be input via a keyboard, a touchscreen (e.g., with haptics or tactile feedback), a speech input, an eye tracking input, a brain monitoring system, or any other comparable input mechanism. Other types of the input device may include a cursor control device, such as a mouse, a trackball, or cursor direction keys, etc. The output device may include a display, a printer, or the like, or any combination thereof.

The network 150 may include any suitable network that can facilitate the exchange of information and/or data for the MRI system 100. In some embodiments, one or more components (e.g., the MRI scanner 110, the processing device 120, the storage device 130, the terminal device 140) of the MRI system 100 may communicate information and/or data with one or more other components of the MRI system 100 via the network 150. For example, the processing device 120 may obtain MR data from the MRI scanner 110 via the network 150. As another example, the processing device 120 and/or the terminal device 140 may obtain information stored in the storage device 130 via the network 150.

In some embodiments, the network 150 may be and/or include a public network (e.g., the Internet), a private network (e.g., a local area network (LAN), a wide area network (WAN)), etc.), a wired network (e.g., an Ethernet network), a wireless network (e.g., an 802.11 network, a Wi-Fi network, etc.), a cellular network (e.g., a Long Term Evolution (LTE) network), a frame relay network, a virtual private network (VPN), a satellite network, a telephone network, routers, hubs, witches, server computers, and/or any combination thereof. For example, the network 150 may include a cable network, a wireline network, a fiber-optic network, a telecommunications network, an intranet, a wireless local area network (WLAN), a metropolitan area network (MAN), a public telephone switched network (PSTN), a Bluetooth™ network, a ZigBee™ network, a near field communication (NFC) network, or the like, or any combination thereof. In some embodiments, the network 150 may include one or more network access points. For example, the network 150 may include wired and/or wireless network access points such as base stations and/or internet exchange points through which one or more components of the MRI system 100 may be connected to the network 150 to exchange data and/or information.

This description is intended to be illustrative, and not to limit the scope of the present disclosure. Many alternatives, modifications, and variations will be apparent to those skilled in the art. The features, structures, methods, and other characteristics of the exemplary embodiments described herein may be combined in various ways to obtain additional and/or alternative exemplary embodiments. However, those variations and modifications do not depart the scope of the present disclosure. In some embodiments, the MRI system 100 may include one or more additional components and/or one or more components described above may be omitted. Additionally or alternatively, two or more components of the MRI system 100 may be integrated into a single component. For example, the processing device 120 may be integrated into the MRI scanner 110. As another example, a component of the MRI system 100 may be replaced by another component that can implement the functions of the component. As still another example, the processing device 120 and the terminal device 140 may be integrated into a single device.

Figure 2:
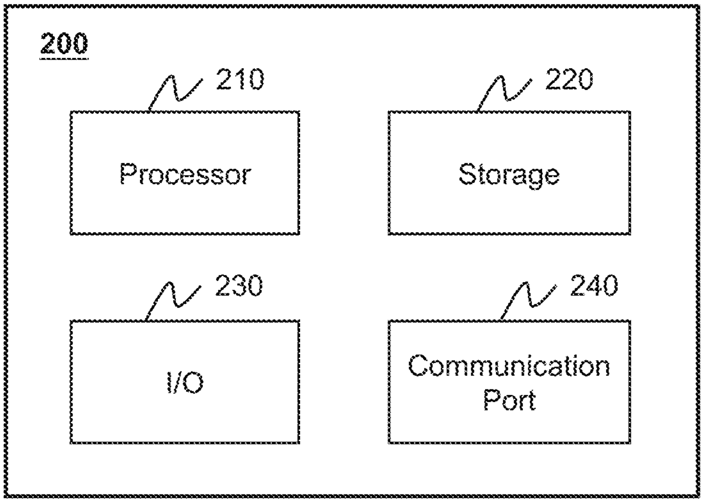
FIG. 2 is a schematic diagram illustrating exemplary hardware and/or software components of an exemplary computing device according to some embodiments of the present disclosure.

FIG. 2 is a schematic diagram illustrating exemplary hardware and/or software components of an exemplary computing device according to some embodiments of the present disclosure. In some embodiments, one or more components of the MRI system 100 may be implemented on one or more components of the computing device 200. Merely by way of example, the processing device 120 and/or the terminal device 140 may be implemented on one or more components of the computing device 200, respectively.

As illustrated in FIG. 2, the computing device 200 may include a processor 210, a storage device 220, an input/output (I/O) 230, and a communication port 240. The processor 210 may execute computer instructions (e.g., program code) and perform functions of the processing device 120 in accordance with techniques described herein. The computer instructions may include, for example, routines, programs, objects, components, data structures, procedures, modules, and functions, which perform particular functions described herein. For example, the processor 210 may process image data of a subject obtained from the MRI scanner 110, the storage device 130, terminal device 140, and/or any other component of the MRI system 100.

In some embodiments, the processor 210 may include one or more hardware processors, such as a microcontroller, a microprocessor, a reduced instruction set computer (RISC), an application specific integrated circuits (ASICs), an application-specific instruction-set processor (ASIP), a central processing unit (CPU), a graphics processing unit (GPU), a physics processing unit (PPU), a microcontroller unit, a digital signal processor (DSP), a field programmable gate array (FPGA), an advanced RISC machine (ARM), a programmable logic device (PLD), any circuit or processor capable of executing one or more functions, or the like, or a combinations thereof.

Merely for illustration, only one processor is described in the computing device 200. However, it should be noted that the computing device 200 in the present disclosure may also include multiple processors. Thus operations and/or method steps that are performed by one processor as described in the present disclosure may also be jointly or separately performed by the multiple processors. For example, if in the present disclosure the processor of the computing device 200 executes both operation A and operation B, it should be understood that operation A and operation B may also be performed by two or more different processors jointly or separately in the computing device 200 (e.g., a first processor executes operation A and a second processor executes operation B, or the first and second processors jointly execute operations A and B).

The storage device 220 may store data/information obtained from the MRI scanner 110, the storage device 130, the terminal device 140, and/or any other component of the MRI system 100. In some embodiments, the storage device 220 may include a mass storage device, a removable storage device, a volatile read-and-write memory, a read-only memory (ROM), or the like, or any combination thereof. For example, the mass storage device may include a magnetic disk, an optical disk, a solid-state drive, etc. The removable storage device may include a flash drive, a floppy disk, an optical disk, a memory card, a zip disk, a magnetic tape, etc. The volatile read-and-write memory may include a random-access memory (RAM). The RAM may include a dynamic RAM (DRAM), a double date rate synchronous dynamic RAM (DDR SDRAM), a static RAM (SRAM), a thyristor RAM (T-RAM), and a zero-capacitor RAM (Z-RAM), etc. The ROM may include a mask ROM (MROM), a programmable ROM (PROM), an erasable programmable ROM (EPROM), an electrically erasable programmable ROM (EEPROM), a compact disk ROM (CD-ROM), and a digital versatile disk ROM, etc. In some embodiments, the storage device 220 may store one or more programs and/or instructions to perform exemplary methods described in the present disclosure.

The I/O 230 may input and/or output signals, data, information, etc. In some embodiments, the I/O 230 may enable a user interaction with the computing device 200. In some embodiments, the I/O 230 may include an input device and an output device. Examples of the input device may include a keyboard, a mouse, a touch screen, a microphone, or the like, or any combination thereof. Examples of the output device may include a display device, a loudspeaker, a printer, a projector, or the like, or any combination thereof. Examples of the display device may include a liquid crystal display (LCD), a light-emitting diode (LED)-based display, a flat panel display, a curved screen, a television device, a cathode ray tube (CRT), a touch screen, or the like, or any combination thereof.

The communication port 240 may be connected to a network (e.g., the network 150) to facilitate data communications. The communication port 240 may establish connections between the computing device 200 (e.g., the processing device 120) and one or more components of the MRI system 100 (e.g., the MRI scanner 110, the storage device 130, and/or the terminal device 140). The connection may be a wired connection, a wireless connection, any other communication connection that can enable data transmission and/or reception, and/or a combination of these connections. The wired connection may include, for example, an electrical cable, an optical cable, a telephone wire, or the like, or a combination thereof. The wireless connection may include, for example, a Bluetooth™ link, a Wi-Fi™ link, a WiMax™ link, a WLAN link, a ZigBee link, a mobile network link (e.g., 3G, 4G, 5G, etc.), or the like, or any combination thereof. In some embodiments, the communication port 240 may be and/or include a standardized communication port, such as RS232, RS485, etc. In some embodiments, the communication port 240 may be a specially designed communication port. For example, the communication port 240 may be designed in accordance with the digital imaging and communications in medicine (DICOM) protocol.

Figure 3:
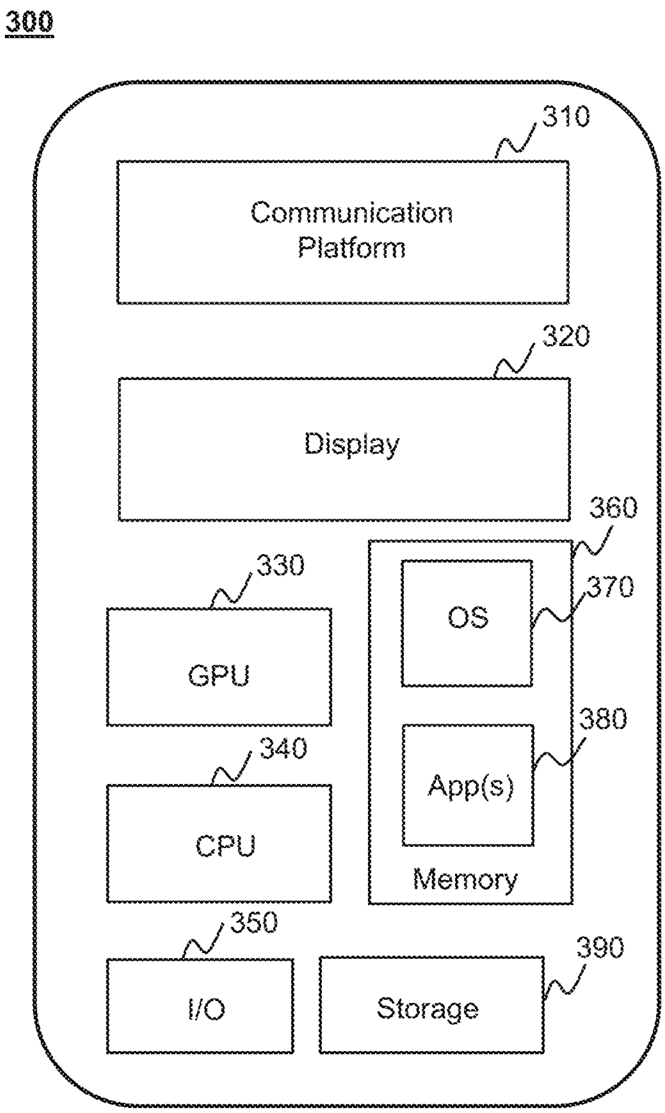
FIG. 3 is a schematic diagram illustrating exemplary hardware and/or software components of an exemplary terminal device according to some embodiments of the present disclosure.

FIG. 3 is a schematic diagram illustrating exemplary hardware and/or software components of an exemplary terminal device according to some embodiments of the present disclosure. In some embodiments, one or more components of the MRI system 100 may be implemented on one or more components of the terminal device 300. Merely by way of example, the terminal device 140 may be implemented on one or more components of the terminal device 300.

As illustrated in FIG. 3, the terminal device 300 may include a communication platform 310, a display 320, a graphics processing unit (GPU) 330, a central processing unit (CPU) 340, an I/O 350, a memory 360, and a storage 390. In some embodiments, any other suitable component, including but not limited to a system bus or a controller (not shown), may also be included in the terminal device 300. In some embodiments, an operating system 370 (e.g., iOS™, Android™, Windows Phone™) and one or more applications 380 may be loaded into the memory 360 from the storage 390 in order to be executed by the CPU 340. The applications 380 may include a browser or any other suitable apps for receiving and rendering information relating to the MRI system 100. User interactions with the information stream may be achieved via the I/O 350 and provided to the processing device 120 and/or other components of the MRI system 100 via the network 150.

In some embodiments, the terminal device 300 may present output data related to at least a part of the channel parameters corresponding to the plurality of channels to a user. The output data may include various forms of data, such as a table, a graph, texts, etc. For example, the terminal device 300 may present a waveform generated based on the channel parameters of a channel to the user. In some embodiments, the user may view the output data via the display 320. In some embodiments, the user may issue an export request for exporting at least one channel parameter corresponding to at least one of the plurality of channels via the terminal device 300. In some embodiments, the user may issue an update request for updating one or more channel parameters via the terminal device 300.

To implement various modules, units, and their functionalities described in the present disclosure, computer hardware platforms may be used as the hardware platform(s) for one or more of the elements described herein. A computer with user interface elements may be used to implement a personal computer (PC) or any other type of work station or terminal. A computer may also act as a server if appropriately programmed.

Figure 4:
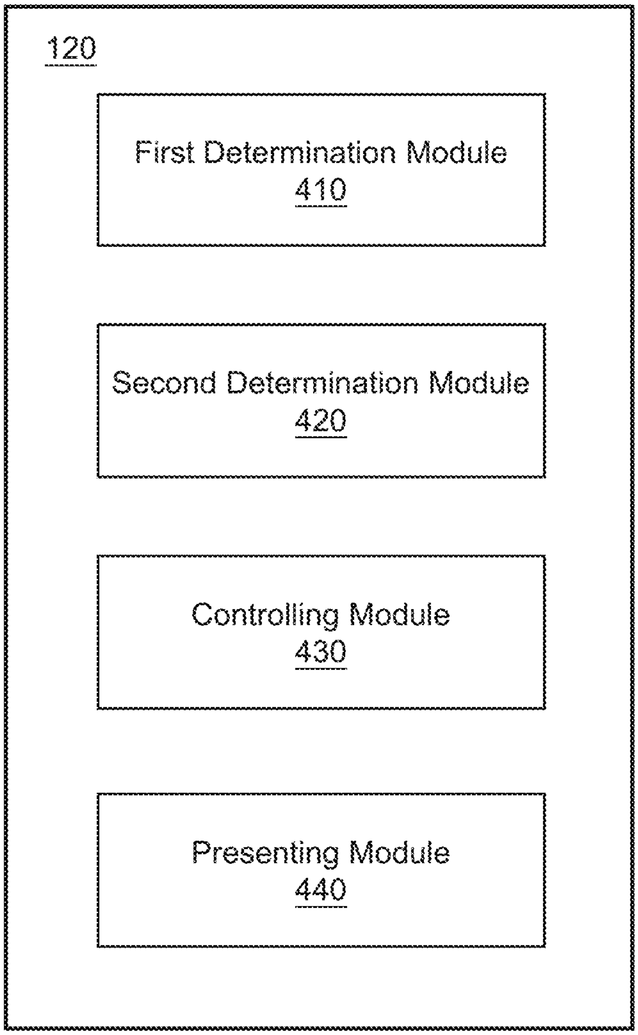
FIG. 4 is a schematic diagram illustrating an exemplary processing device according to some embodiments of the present disclosure.

FIG. 4 is a schematic diagram illustrating an exemplary processing device according to some embodiments of the present disclosure. In some embodiments, the processing device 120 may include a first determination module 410, a second determination module 420, a controlling module 430, and a presenting module 440. In some embodiments, the modules may be hardware circuits of all or part of the processing device 120. The modules may also be implemented as an application or set of instructions read and executed by the processing device 120. Further, the modules may be any combination of the hardware circuits and the application/instructions. For example, the modules may be part of the processing device 120 when the processing device 120 is executing the application/set of instructions. In some embodiments, the processing device 120 may include a processor implemented on the terminal device 140.

The first determination module 410 may determine a plurality of radiofrequency (RF) parameters. The plurality of RF parameters may include at least one channel parameter corresponding to each of a plurality of channels. The at least one channel parameter may include a phase modulation parameter (also referred to as a "phase parameter"), an amplitude modulation parameter (also referred to as an "amplitude parameter"), an excitation power (e.g., an excitation power of a specific channel for exciting the slice), a specific absorption ratio (SAR) (e.g., an SAR when exciting the slice by a specific channel), or the like, or any combination thereof. In some embodiments, the excitation power and/or the SAR may relate to the phase modulation parameter and/or the amplitude modulation parameter.

In some embodiments, the first determination module 410 may include a first obtaining unit and a first determination unit. The first obtaining unit may obtain a sensitivity distribution of the plurality of channels with respect to the slices. The first determination unit may determine a plurality of RF parameters corresponding to the slice based on the sensitivity distribution of the plurality of channels with respect to the slice. In some embodiments, the first obtaining unit may obtain a preset magnetization distribution result and a preset K-space excitation trajectory. The first determination unit may determine, for each slice, the plurality of RF parameters corresponding to the slice using a first preset algorithm based on the sensitivity distribution of the plurality of channels with respect to the slices, the preset magnetization distribution result, and the preset K-space excitation trajectory. In some embodiments, the first determination module 410 may further include an adjusting unit and a second determination unit. The adjusting unit may adjust the preset K-space excitation trajectory to obtain an adjusted K-space excitation trajectory. The second determination unit may determine the plurality of RF parameters corresponding to the slice based on the preset magnetization distribution result and the adjusted K-space excitation trajectory.

The second determination module 420 may determine a slice group based at least in part on the RF parameters corresponding to the plurality of slices. The slice group may include at least two slices selected from the plurality of slices. In some embodiments, the second determination module 420 may include a second obtaining unit and a third determination unit. The second obtaining unit may obtain, for each slice, an excitation power for each channel for exciting the slice based on RF parameters corresponding to the slice. The third determination unit may determine a slice group from the plurality of slices based on the excitation powers of the plurality of channels for exciting the plurality of slices. In some embodiments, for each of the plurality of channels, the third determination unit may determine a power difference between a related power of the channel and the excitation power of the channel for exciting the first slice. For at least one of the plurality of channels, the third determination unit may determine at least one first candidate slice based on the power difference from other slices excluding the first slice.

In some embodiments, the third determination unit may determine a total excitation of the plurality of channels for exciting a second slice. In some embodiments, in response to determining that the total excitation power is greater than a preset total power threshold, for each of the plurality of channels, the third determination unit may determine a candidate excitation power of the channel for exciting other slices excluding the second slice based on corresponding RF parameters. In some embodiments, the third determination unit may determine at least one second candidate slice from other slices based on the candidate excitation powers corresponding to the channels for exciting the other slices, wherein a second total excitation power of the plurality of channels for concurrently exciting the second slice and the at least one second candidate slice is less than or equal to the total power threshold. In some embodiments, the third determination unit may determine a slice group based on the second slice and the at least one second candidate slice.

The control module 430 may direct at least a portion of the plurality of channels to excite the slice group based on RF parameters corresponding to the slice group. In some embodiments, the control module 430 may include an SAR determination unit and a controlling unit. The SAR determination unit may estimate an SAR resulted from target RF signals emitted by at least a portion of the plurality of channels according to the target RF parameters. In response to determining that the total SAR is greater than a preset SAR (or a SAR threshold) which may be determined based on attribute information of the subject to be scanned or system default, the controlling unit may control at least one of the plurality of channels to be mistuned.

The presenting module 440 may process data that needs to be presented on a terminal device (e.g., the terminal device 140) and/or determine the manner for presenting the data. For instance, the presenting module 440 may direct the terminal device 140 to present output data related to at least a part of the channel parameters corresponding to the plurality of channels. In some embodiments, the presenting module 440 may direct the terminal device to present one or more marks and output data related to at least one channel parameter corresponding to one of the plurality of channels. The one or more marks may be used to provide an unfold option for presenting output data related to at least one channel parameter corresponding to at least one of other channels. In some embodiments, in response to receiving an export request for exporting at least one channel parameter corresponding to at least one of the plurality of channels via the terminal device, the presenting module 440 may export the corresponding at least one channel parameter based on the export request (or direct the terminal device 140 to export the corresponding at least one channel parameter based on the export request). In some embodiments, in response to receiving an update request for updating one or more of the channel parameters corresponding to the plurality of channels via the terminal device, the presenting module 440 may update the one or more channel parameters based on the update request. In some embodiments, the presenting module 440 may verify one or more of the channel parameters corresponding to the plurality of channels based on one or more reference datasets.

In some embodiments, the presenting module 440 may include a processing unit, a first presenting unit, an exporting unit, and a receiving unit. The processing unit may perform a visualization process on the at least a part of the channel parameters to obtain the output data corresponding to the plurality of channels. The first presenting unit may obtain the output data and direct the terminal device 140 to present the output data. In response to receiving an export request for exporting at least one channel parameter corresponding to at least one of the plurality of channels via the terminal device 140, the exporting unit may export the corresponding at least one channel parameter based on the export request. In response to receiving an update request for updating one or more of the channel parameters corresponding to the plurality of channels via the terminal device 140, the receiving unit may update the one or more channel parameters based on the update request. In some embodiments, the first presenting unit may obtain a preset parameter presenting card template in response to a request for presenting RF parameters. The first presenting unit may further generate a parameter presenting card to be presented on a user interface based on the preset parameter presenting card template and output data related to RF parameters.

In some embodiments, the presenting module 440 may further include a selection unit. The selection unit may select a preliminary channel according to a preset single-channel presenting strategy. The first presenting unit may present output data related to RF parameters corresponding to the preliminary channel and one or more marks. The first presenting unit may present output data related to RF parameters of at least one of other channels based on the one or more marks. In some embodiments, the first presenting unit may direct the terminal device to present a second waveform corresponding to one of other channels by superimposing the second waveform on a first waveform corresponding to the preliminary channel. In some embodiments, the first presenting unit may include a verification unit. The verification unit may verify one or more of the channel parameters corresponding to the plurality of channels based on one or more reference datasets.

In some embodiments, the presenting module 440 may include a third obtaining unit, a fourth obtaining unit, and a second presenting unit. The third obtaining unit may perform a visualization process on the at least a part of the channel parameters to obtain the output data corresponding to the plurality of channels. The fourth obtaining unit may obtain a preset parameter presenting card template in response to a request for presenting RF parameters. The second presenting unit may further generate a parameter presenting card to be presented on a user interface based on the preset parameter presenting card template and output data related to RF parameters.

It should be noted that the above description of the processing device 120 is merely provided for the purposes of illustration, and not intended to limit the scope of the present disclosure. For persons having ordinary skills in the art, multiple variations and modifications may be made under the teachings of the present disclosure. However, those variations and modifications do not depart from the scope of the present disclosure. Two or more of the modules may be combined as a single module, and any one of the modules may be divided into two or more units.

It should be noted that the above description is merely provided for the purposes of illustration, and not intended to limit the scope of the present disclosure. For persons having ordinary skills in the art, multiple variations and modifications may be made under the teachings of the present disclosure. However, those variations and modifications do not depart from the scope of the present disclosure. For example, the processing device 120 may further include a storage module (not shown in FIG. 4). The storage module may be configured to store data generated during any process performed by any component of in the processing device 120. As another example, each of the components of the processing device 120 may include a storage device. Additionally or alternatively, the components of the processing device 120 may share a common storage device.

Figure 5:
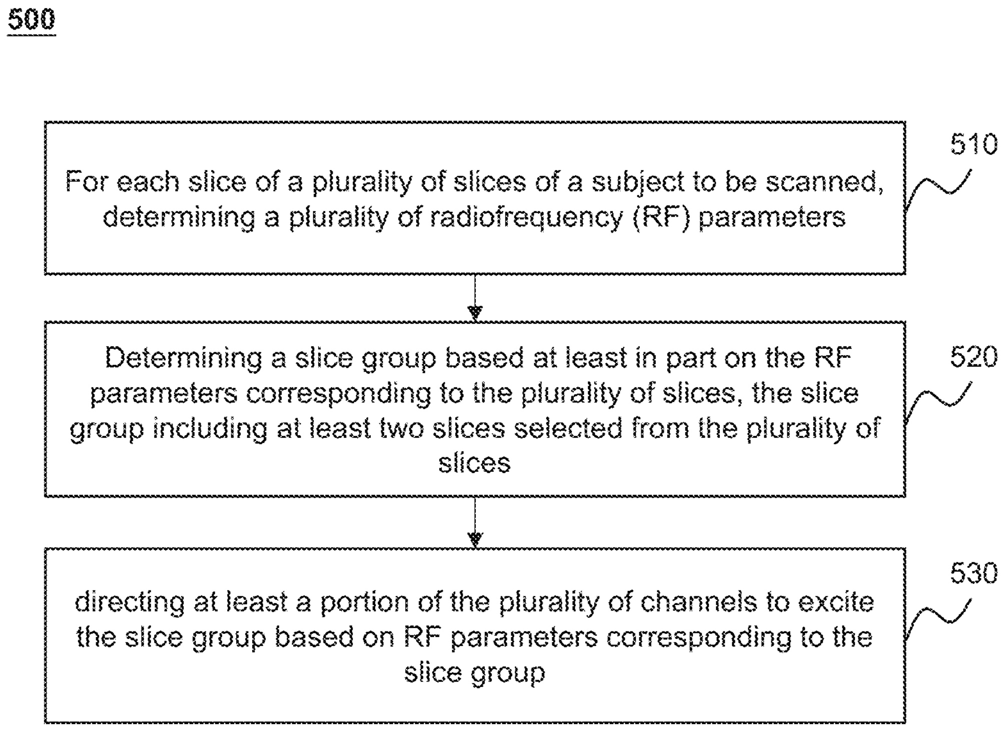
FIG. 5 is a flowchart illustrating an exemplary process for controlling MRI according to some embodiments of the present disclosure.

FIG. 5 is a flowchart illustrating an exemplary process for controlling MRI according to some embodiments of the present disclosure. In some embodiments, the process 500 may be implemented in the MRI system 100 illustrated in FIG. 1. For example, the process 500 may be stored in the storage device 130, the storage 220, and/or the storage 390 as a form of instructions, and invoked and/or executed by the processing device 120 (e.g., the processor 210 of the computing device 200 illustrated in FIG. 2 and/or one or more modules illustrated in FIG. 4). The operations of the illustrated process presented below are intended to be illustrative. In some embodiments, the process 500 may be accomplished with one or more additional operations not described, and/or without one or more of the operations discussed. Additionally, the order in which the operations of the process 500 as illustrated in FIG. 5 and described below is not intended to be limiting.

In 510, for each slice of a plurality of slices of a subject to be scanned, the processing device 120 (e.g., the first determination module 410) may determine a plurality of radiofrequency (RF) parameters.

In some embodiments, the subject to be scanned may include a patient, a man-made object, etc. In some embodiments, the subject may include a specific portion, an organ, a tissue, and/or a physical point of the patient. Merely by way of example, the subject may include a head, a brain, a neck, a shoulder, an arm, a thorax, a heart, a stomach, a blood vessel, a soft tissue, a knee, a foot, or the like, or any combination thereof.

Figure 6:
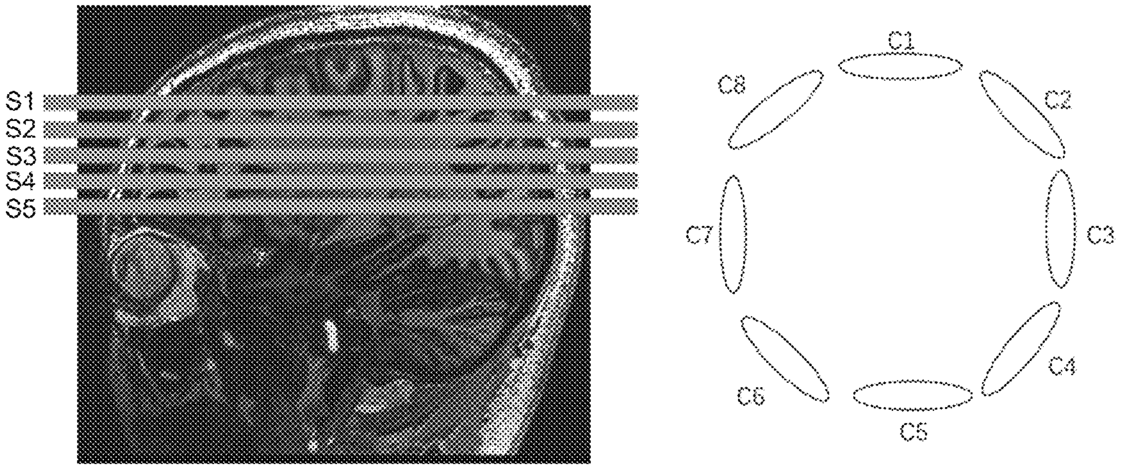
FIG. 6 is a schematic diagram illustrating exemplary slices of a subject and exemplary channels of an MRI scanner according to some embodiments of the present disclosure.

In some embodiments, the processing device 120 may divide the subject into a plurality of slices (e.g., slices S1, S2, S3, S4, and S5 illustrated in FIG. 6) based on structural features of the subject. In some embodiments, each slice may be divided into rows and columns to form a matrix of individual tissue voxels. In some embodiments, thicknesses of different slices may be different. Alternatively, the thicknesses of the plurality of slices may be partially the same or different.

In some embodiments, as described in connection with FIG. 1, the MR scanner 110 may include one or more coils (each of which may include multiple channels, hereafter collectively called "channel" for brevity) that emit RF signals providing a magnetic field for exciting the slices. Accordingly, the plurality of RF parameters for each slice may include at least one channel parameter corresponding to each of a plurality of channels (e.g., channels C1, C2, C3, C4, C5, C6, C7, and C8 illustrated in FIG. 6).

In some embodiments, the at least one channel parameter may include a phase modulation parameter (also referred to as a "phase parameter"), an amplitude modulation parameter (also referred to as an "amplitude parameter"), an excitation power (e.g., an excitation power of a specific channel for exciting the slice), a specific absorption ratio (SAR) (e.g., a SAR when exciting the slice by a specific channel), or the like, or any combination thereof. In some embodiments, the excitation power and/or the SAR may relate to the phase modulation parameter and/or the amplitude modulation parameter. In some embodiments, for the plurality of channels, corresponding channel parameters may be set independently.

In some embodiments, for each slice, the processing device 120 may determine the plurality of RF parameters (e.g., the at least one channel parameter corresponding to each of a plurality of channels) based on attribute information of the slice attribute information of the plurality of channels (e.g., the sensitivity of each channel with respect to the slice, a power threshold of each channel), imaging data related to the slice, or the like, or any combination thereof. Merely by way of example, the attribute information of the slice may include the main static magnetic field, the radiofrequency field, etc. The attribute information of the plurality of channels (or coils) may include but not limited to information associated with an excitation field of each excitation channel (i.e., a channel configured to generate RF signals for exciting one or more slices) and a reception field of each reception channel (i.e., a channel configured to receive MR signals). The attribute information of the imaging data related to the slice may include, for example, a homogeneity feature of an image generated based on the imaging data. In some embodiments, if the homogeneity of the image does not meet corresponding requirements, the adopted RF parameters may need to be modified. In some embodiments, the processing device 120 may determine the plurality of RF parameters corresponding to the slice based on a set of sensitivity parameters corresponding to the plurality of channels respectively with respect to the slice. More descriptions regarding determining the plurality of RF parameters based on the sensitivity parameters may be found elsewhere in the present disclosure, for example, in FIGS. 7-9 and the descriptions thereof.

In some embodiments, for each slice, the processing device 120 may receive a user instruction (e.g., a user input) via the terminal device 140 and determine the plurality of RF parameters based on the user instruction. In some embodiments, the user may provide the user instruction through a keyboard, a mouse, a touch screen, or the like, or any combination thereof.

In some embodiments, for each slice, the processing device 120 may obtain the plurality of RF parameters from other devices, such as the storage device 130 or an external device.

In 520, the processing device 120 (e.g., the second determination module 420) may determine a slice group based at least in part on the RF parameters corresponding to the plurality of slices, the slice group including at least two slices selected from the plurality of slices.

In some embodiments, as mentioned above, for each slice, the at least one channel parameter corresponding to each of the plurality of channels may include the excitation power of the channel for exciting the slice. Accordingly, the processing device 120 may determine the slice group based at least in part on the excitation powers of the plurality of channels for exciting the plurality of slices. More descriptions may be found elsewhere in the present disclosure, for example, in FIGS. 10-11 and the descriptions thereof.

In some embodiments, the processing device 120 may select a first slice to be excited from the plurality of slices. The processing device 120 may select the first slice randomly or according to actual requirements. Then for each of the plurality of channels, the processing device 120 may determine a power difference between a power threshold of the channel and an excitation power of the channel for exciting the first slice. The processing device 120 may further select at least one first candidate slice based on the power difference corresponding to at least one of the plurality of channels. Then the processing device 120 may determine a slice group including the first slice and the at least one first candidate slice. More descriptions may be found elsewhere in the present disclosure, for example, in FIGS. 12-14 and the descriptions thereof.

In some embodiments, the processing device 120 may select a second slice to be excited from the plurality of slices. The processing device 120 may select the second slice randomly or according to actual requirements. Then the processing device 120 may determine a first total excitation power of the plurality of channels for exciting the second slice. The processing device 120 may determine whether the first total excitation power of the plurality of channels for exciting the second slice exceeds a total power threshold. In response to determining that the first total excitation power exceeds the total power threshold, the processing device 120 may determine at least one second candidate slice based on the excitation power of each channel of the plurality of channels for exciting each slice of the plurality of slices, such that a second total excitation power of the plurality of channels for concurrently exciting the second slice and the at least one second candidate slice is less than or equal to the total power threshold. Then the processing device 120 may determine a slice group including the second slice and the at least one second candidate slice. More descriptions may be found elsewhere in the present disclosure, for example, in FIGS. 15-17 and the descriptions thereof.

In some embodiments, as mentioned above, for each slice, the at least one channel parameter corresponding to each of the plurality of channels may include the SAR corresponding to the channel when exciting the slice. Accordingly, the processing device 120 may determine the slice group based at least in part on the SARs corresponding to the plurality of channels for exciting the plurality of slices.

In some embodiments, the processing device 120 may select a third slice to be excited from the plurality of slices. The processing device 120 may select the third slice randomly or according to actual requirements. For each of the plurality of slices, the processing device 120 may estimate a SAR corresponding to the slice based on the RF parameters of the plurality of channels for exciting the slice, a body weight of the subject, the slice thickness of the third slice, or the like, or any combination thereof. In some embodiments, the processing device 120 may compare a first SAR corresponding to the third slice with a SAR threshold (which may be an experience value or a system default value). In response to determining that the first SAR is less than the SAR threshold, the processing device 120 may determine a SAR difference between the SAR threshold and the first SAR. The processing device 120 may determine at least one third candidate slice based on the SAR difference, wherein a total SAR corresponding to the third slice and the at least one third candidate slice concurrently is less than the SAR threshold. The processing device 120 may determine a slice group that includes the third slice and the third candidate slice.

In some embodiments, in response to determining that the SAR corresponding to exciting the third slice is greater than the SAR threshold, the processing device 120 may determine that one or more channels that are planned to be used for exciting the third slice (e.g., one or more channels corresponding to the highest excitation powers for exciting the third slice) may be used for exciting at least one fourth candidate slice instead. Such an adjustment may cause the total SAR corresponding to the third slice and the at least one fourth candidate slice to be less than or equal to the SAR threshold.

In 530, the processing device 120 (e.g., the controlling module 430) may direct at least a portion of the plurality of channels to excite the slice group based on RF parameters (also referred to as "target RF parameters") corresponding to the slice group.

In some embodiments, slices in the slice group are excited at the same time. In some embodiments, the processing device 120 may determine multiple slice groups and direct at least a portion of the plurality of channels to excite the slice groups sequentially (e.g., first excitation, second excitation, third excitation, fourth excitation, fifth excitation illustrated in FIG. 13; or first excitation, second excitation, third excitation, fourth excitation, fifth excitation illustrated in FIG. 16).

In some embodiments, the processing device 120 may determine an imaging protocol including the slice groups and RF parameters related to the slice groups. The processing device 120 may transmit the imaging protocol to the MRI scanner 110. The MRI scanner 110 may perform an imaging scan on the subject according to the imaging protocol.

In some embodiments, the processing device 120 may estimate a SAR resulting from target RF signals emitted by at least a portion of the plurality of channels according to the target RF parameters. In response to determining that the total SAR is greater than a preset SAR (or a SAR threshold) which may be determined based on attribute information of the subject to be scanned or system default, the processing device 120 may control at least one of the plurality of channels to be mistuned. For example, the processing device 120 may forbid at least one channel from emitting corresponding target RF signals. Merely by way of example, with reference to FIG. 6, when channels C1-C8 are all used for emitting corresponding target RF signals, the processing device 120 may determine a corresponding total SAR. In response to determining that the total SAR is greater than the preset SAR, the processing device 120 may forbid at least one channel of channels C1-C8 from emitting corresponding target RF signals. Accordingly, the subject can be protected from unnecessary damage by the imaging scan.

In some embodiments, the processing device 120 may direct the terminal device 140 to present output data related to at least a part of the channel parameters corresponding to the plurality of channels. For instance, the user may issue a presenting request via the terminal device 140. In response to receiving the presenting request, the processing device 120 may present the output data to the user according to the presenting request. In some embodiments, the output data may include a table, a graph, a report, or other data presenting forms, which are not limited by the present disclosure.

In some embodiments, the processing device 120 may perform a visualization process on the at least a part of the channel parameters to obtain the output data corresponding to the plurality of channels. For instance, the output data corresponding to a specific channel may include a waveform reflecting the phase modulation parameter and/or the amplitude modulation parameter of the channel. In some embodiments, the processing device 120 may generate the waveform directly based on the phase modulation parameter and/or the amplitude modulation parameter. In some embodiments, the processing device 120 may modify the phase modulation parameter and/or the amplitude modulation parameter and generate the waveform so that the waveform is made more suitable for the user to review. In some embodiments, the visualization process may include other operations, such as the determination/adjustment of a font type, a font size, a text color, or the like, or any combination thereof, which are not limited by the present disclosure. In some embodiments, at least a part of the visualization process may be performed by the terminal device 140.

In some embodiments, the processing device 120 may direct the terminal device 140 to concurrently present RF parameters corresponding to different channels. In some embodiments, the processing device 120 may direct the terminal device 140 to present RF parameters corresponding to a single channel (e.g., a preliminary channel) and one or more marks (e.g., a radiofrequency identification (RFID)) which provide an unfolding option for presenting RF parameters corresponding to other channels. In some embodiments, for each channel, the processing device 120 may present output data related to all the RF parameters corresponding to the channel or a portion of the RF parameters corresponding to the channel.

In some embodiments, in response to receiving an export request for exporting at least one channel parameter corresponding to at least one of the plurality of channels via the terminal device 140, the processing device 120 may export the corresponding at least one channel parameter based on the export request. For example, in response to receiving the export request, the processing device 120 may obtain a pre-stored export template including metadata related to the plurality of channels, such as RFIDs, attribute information related to the RF parameters, etc. The format of the pre-stored export template may include a text format, an extensible markup language (XML) format, etc. The processing device 140 may fill the export template using determined values of the RF parameters, thereby obtaining a target export result. In some embodiments, the target export result may be transmitted to a storage device (e.g., the storage device 130).

In some embodiments, in response to receiving an update request for updating one or more of the channel parameters corresponding to the plurality of channels via the terminal device 140, the processing device 120 may update the one or more channel parameters based on the update request. For instance, a user may view the channel parameters and modify one or more of the channel parameters via the terminal device 140 by issuing an update request.

In some embodiments, the user may issue the export request or update request by triggering a corresponding option presented on the terminal device 140. For instance, the user may click on a button presented on an interface of the terminal device 140 to issue the export request or the update request.

In some embodiments, the processing device 120 may verify one or more of the channel parameters corresponding to the plurality of channels based on one or more reference datasets (e.g., a reference waveform corresponding to a specific channel). For a specific channel, the processing device 120 may compare a waveform corresponding to the channel with a corresponding reference waveform. In response to determining that a difference between the waveform and the reference waveform is less than or equal to a preset threshold, the processing device 120 may determine that the verification is "passed." In response to determining that the difference between the waveform and the reference waveform is larger than the preset threshold, the processing device 120 may determine that the verification is "failure." Accordingly, the processing device 120 may generate an alert and notify the user that corresponding channel parameters may need modification. In some embodiments, a user may manually verify the one or more channel parameters, which is not limited by the present disclosure.

It should be noted that the above description regarding the process 500 is merely provided for the purposes of illustration, and not intended to limit the scope of the present disclosure. For persons having ordinary skills in the art, multiple variations and modifications may be made under the teachings of the present disclosure. However, those variations and modifications do not depart from the scope of the present disclosure. Merely by way of example, in some embodiments, the processing device 120 may determine only one slice group based on the plurality of slices of the subject. For instance, the size of the subject to be scanned may be relatively small and the slice group may include all the slices of the subject. The processing device 120 may direct at least a portion of the plurality of channels of the MRI scanner 110 to excite all the slices of the subject concurrently.

Figure 7:
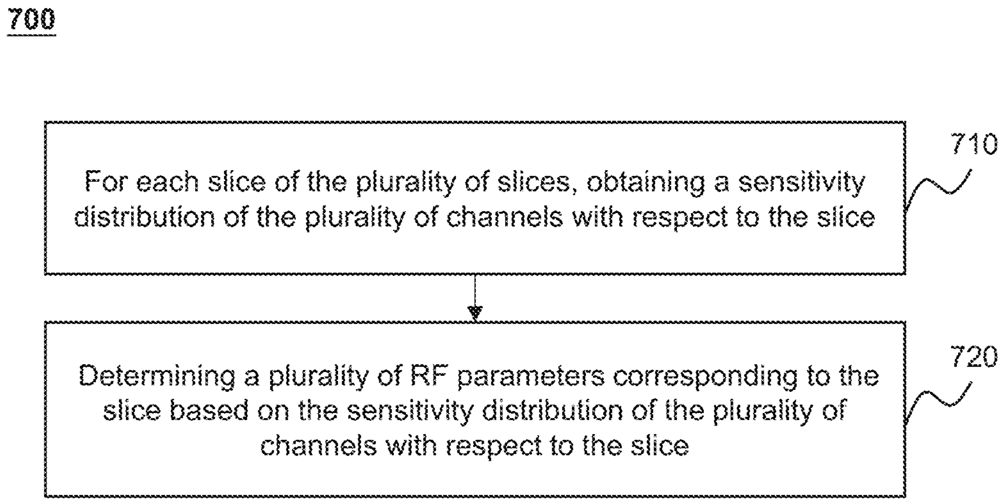
FIG. 7 is a flowchart illustrating an exemplary process for determining RF parameters corresponding to a slice according to some embodiments of the present disclosure.

FIG. 7 is a flowchart illustrating an exemplary process for determining RF parameters corresponding to a slice according to some embodiments of the present disclosure. In some embodiments, operation 510 of process 500 may be performed based on process 700. For illustration purposes, a single slice is described as an example.

In 710, the processing device 120 (e.g., the first determination module 410) may obtain a sensitivity distribution of the plurality of channels with respect to the slice.

In some embodiments, the sensitivity distribution of the plurality of channels with respect to the slice may include or may be reflected by a set of sensitivity parameters corresponding to the plurality of channels respectively with respect to the slice.

In some embodiments, the processing device 120 may determine the sensitivity distribution of the plurality of channels with respect to the slice based on the positions of the plurality of channels with respect to the slice and MR signals received by the plurality of channels after the plurality of channels emit the same RF pulse signals. For example, the plurality of channels may transmit detection RF pulses to the slice by executing an emission filed B1 mapping sequence, and then a B1 mapping image may be generated based on received RF signals. Then the processing device 120 may determine the sensitivity distribution of the plurality of channels with respect to the slice based on the B1 mapping image.

In some embodiments, the processing device 120 may receive the sensitivity distribution of the plurality of channels with respect to the slice from a user input. A user may input the sensitivity distribution through a keyboard, a mouse, a touch screen, or the like, or any combination thereof.

In some embodiments, the processing device 120 may obtain the sensitivity distribution of the plurality of channels with respect to the slice from other devices, such as the storage device 130 or an external device.

In 720, the processing device 120 (e.g., the first determination module 410) may determine a plurality of RF parameters corresponding to the slice based on the sensitivity distribution of the plurality of channels with respect to the slice.

In some embodiments, the processing device 120 may determine the plurality of RF parameters based on the sensitivity distribution of the plurality of channels with respect to the slice using a preset algorithm. In some embodiments, the processing device 120 may determine the plurality of RF parameters for the slice based on the sensitivity distribution of the plurality of channels with respect to the slice, attribute information of the slice, attribute information of the plurality of channels, imaging data related to the slice, or the like, or any combination thereof.

In some embodiments, the processing device 120 may determine the plurality of RF parameters corresponding to the slice based on the sensitivity distribution, a scanning sequence, and a target magnetization. For example, the processing device 120 may direct the plurality of channels to excite the slice for multiple times based on the scanning sequence. The sequence of exciting the slices may be determined based on the plurality of RF parameters corresponding to each slice.

The consideration of the sensitivity distribution during the determination of the RF parameters can improve the accuracy of the determination of the RF parameters, and accordingly improve imaging quality.

Figure 8:
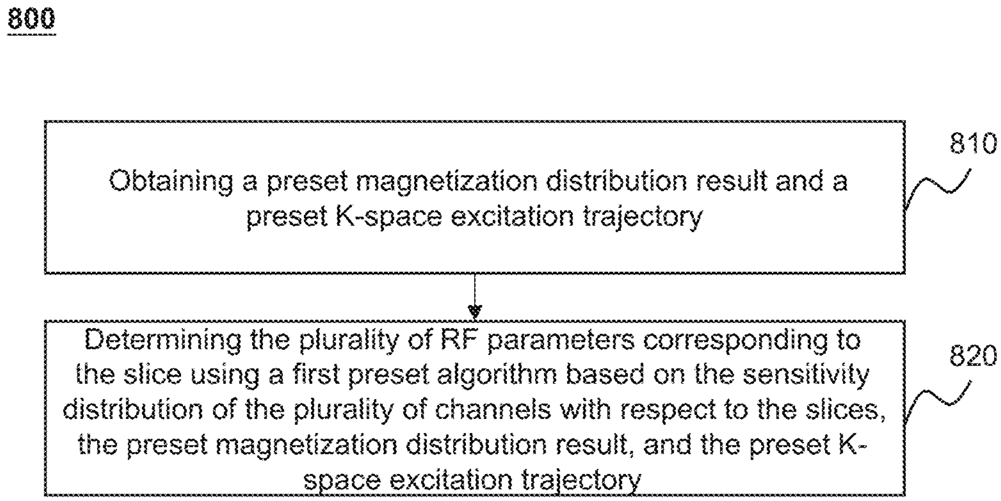
FIG. 8 is a flowchart illustrating an exemplary process for determining RF parameters corresponding to a slice according to some embodiments of the present disclosure.

FIG. 8 is a flowchart illustrating an exemplary process for determining RF parameters corresponding to a slice according to some embodiments of the present disclosure. In some embodiments, operation 720 of process 700 may be performed based on process 800.

In 810, the processing device 120 (e.g., the first determination module 410) may obtain a preset magnetization (also referred to as "magnetization strength") distribution result and a preset K-space excitation trajectory.

The term "magnetization" means a vector field that expresses the density of permanent or induced magnetic dipole moments in a magnetic material. After a still magnetic field is applied to a material, particles may self-spin and re-arrange according to the still magnetic field. The magnetization may be determined based on the arrangement of the particles in the still magnetic field.

In some embodiments, the processing device 120 may determine the preset magnetization distribution result based on requirements of an image to be generated. In some embodiments, the processing device 120 may receive the preset magnetization distribution result from a user input. A user may input data related to the preset magnetization distribution result through a keyboard, a mouse, a touch screen, or the like, or any combination thereof. In some embodiments, the processing device 120 may obtain the preset magnetization distribution result from other devices, such as the storage device 130 or an external device.

In some embodiments, the processing device 120 may determine the preset K-space excitation trajectory based on preset scanning parameters (e.g., according to a preset imaging protocol). In some embodiments, the processing device 120 may receive the preset K-space excitation trajectory from a user input. A user may input data related to the preset K-space excitation trajectory through a keyboard, a mouse, a touch screen, or the like, or any combination thereof. In some embodiments, the processing device 120 may obtain the preset K-space excitation trajectory from other devices, such as the storage device 130 or an external device.

In 820, the processing device 120 (e.g., the first determination module 410) may determine the plurality of RF parameters corresponding to the slice using a first preset algorithm based on the sensitivity distribution of the plurality of channels with respect to the slice, the preset magnetization distribution result, and the preset K-space excitation trajectory. In some embodiments, the first preset algorithm may be in the form of a model, an equation, etc.

For example, the first preset algorithm may be expressed as the following equation (1):

$$m(r) = ir\sum_{c=1}^{Nc} Sc(r)\int b_1(t)e^{ir*k(t)}dt, \quad (1)$$

Considering the fact that the homogeneity of the excitation field or the RF field may be affected by different phases and/or amplitudes of the plurality of channels, the phases and/or the amplitudes of the plurality of channels may be adjusted. Thus, a space excitation difference function (as small as possible) of a total vector corresponding to the plurality of channels may be obtained to improve the space homogeneity of the excitation. Accordingly, the first preset algorithm may be transformed as the following equation (2):

$$m(r) = ir\sum_{c=1}^{Nc} A_c * e^{i\phi_c} Sc(r)\int b_1(t)e^{ir*k(t)}dt, \quad (2)$$

where i represents a complex number field; m(r) represents the preset magnetization distribution result; Sc(r) represents the sensitivity distribution of the plurality of channels with respect to the slice; $b_1(t)$ represents preliminary RF pulses of the plurality of channels, such as sinc pulses, gaussian pulses, Shinnar-Le Roux (SLR) pulses, etc.; k(t) represents the preset K-space excitation trajectory; $A_c$ represents amplitude modulation parameters of the plurality of channels for exciting the slice; $\phi_c$ represents phase modulation parameters of the plurality of channels for exciting the slice; γ represents the magnetogyric ratio, which may be constant for a specific magnetic atom core; Nc represents the total count of the plurality of channels, which is a positive integer.

Accordingly, the processing device 120 may determine the amplitude modulation parameters and phase modulation parameters of the plurality of channels for exciting the slice using the equation (2).

Figure 9:
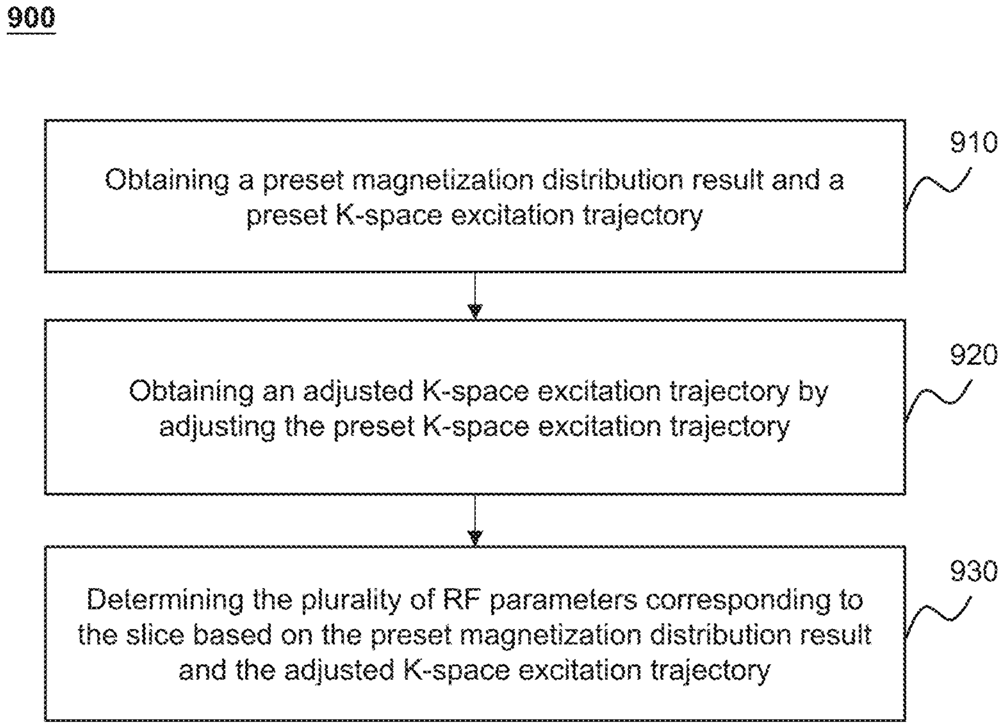
FIG. 9 is a flowchart illustrating an exemplary process for determining RF parameters corresponding to a slice according to some embodiments of the present disclosure.

FIG. 9 is a flowchart illustrating an exemplary process for determining RF parameters corresponding to a slice according to some embodiments of the present disclosure. In some embodiments, the count of groups of RF signals emitted by the plurality of channels may be adjustable. In some embodiments, operation 510 of process 500 or operation 720 of process 700 may be performed based on process 900.

In 910, the processing device 120 (e.g., the first determination module 410) may obtain a preset magnetization distribution result and a preset K-space excitation trajectory. For the preset K-space excitation trajectory, the RF pulses of each of the plurality of channels may correspond to a single spoke excitation. In some embodiments, operation 910 may be performed in a way that is similar to operation 810 of process 800.

In 920, the processing device 120 (e.g., the first determination module 410) may obtain an adjusted K-space excitation trajectory by adjusting the preset K-space excitation trajectory. For the adjusted K-space excitation trajectory, the RF pulses of each of the plurality of channels may correspond to multi-spoke excitation. That is, each channel may reflect multiple excitation pulses successively.

In 930, the processing device 120 (e.g., the first determination module 410) may determine the plurality of RF parameters corresponding to the slice based on the preset magnetization distribution result and the adjusted K-space excitation trajectory.

In some embodiments, the processing device 120 may determine the plurality of RF parameters corresponding to the slice using a second preset algorithm based on the sensitivity distribution of the plurality of channels with respect to the slice, the preset magnetization distribution result, and the adjusted K-space excitation trajectory. In some embodiments, the second preset algorithm may be in the form of a model, an equation, etc.

For example, the second preset algorithm may be expressed as the following equation (3):

$$m(r) = ir\sum_{c=1}^{Nc} Sc(r)\int b_{1c}(t)e^{ir*ks(t)}dt \quad (3)$$

where i represents a complex number field; m(r) represents the preset magnetization distribution result; Sc(r) represents the sensitivity distribution of the plurality of channels with respect to the slice; $b_1(t)$ represents preliminary RF pulses of the plurality of channels, such as sinc pulses, gaussian pulses, Shinnar-Le Roux (SLR) pulses, etc.; ks(t) represents the adjusted K-space excitation trajectory; γ represents the magnetogyric ratio, which may be constant for a specific magnetic atom core; Nc represents the total count of the plurality of channels, which may be a positive integer.

According to equation (3), the processing device 120 may determine the count of groups of RF pulses for each channel. The adjusted K-space excitation trajectory defines the spokes of the RF signals emitted by each channel. A plurality of groups of RF signals may be determined based on the adjusted K-space excitation trajectory, the sensitivity distribution Sc(r), and the target excitation function m(r)

In some embodiments, the processing device 120 may set the count of groups of RF signals for each channel and adjust the preset K-space excitation trajectory to obtain the adjusted K-space excitation trajectory. Accordingly, a single channel can be used to excite two or more slices of the subject concurrently according to the adjusted K-space excitation trajectory, thereby improving imaging scan efficiency and image quality.

Figure 10:
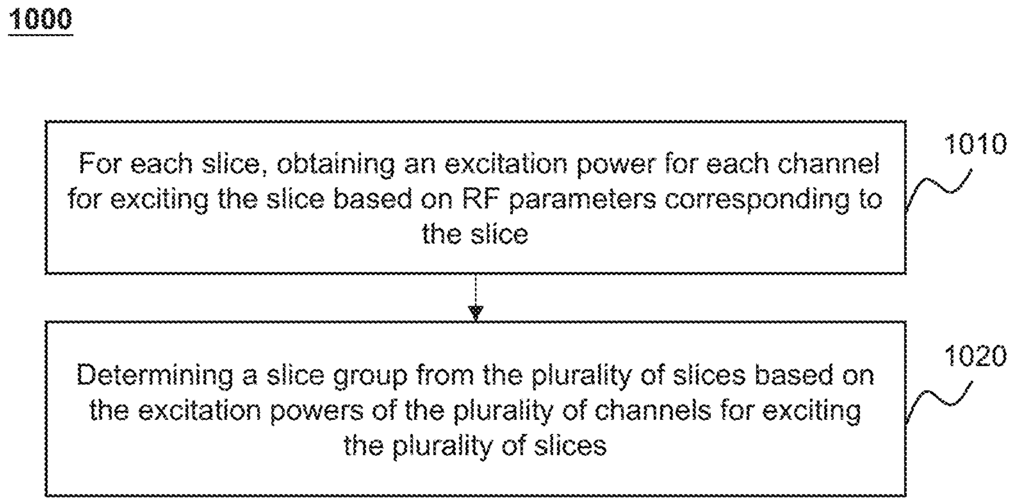
FIG. 10 is a flowchart illustrating an exemplary process for determining a slice group according to some embodiments of the present disclosure.

FIG. 10 is a flowchart illustrating an exemplary process for determining a slice group according to some embodiments of the present disclosure. In some embodiments, operation 520 of process 500 may be performed based on process 1000.

In 1010, for each slice, the processing device 120 (e.g., the second determination module 410) may obtain an excitation power of each channel for exciting the slice based on RF parameters corresponding to the slice.

Figure 11:
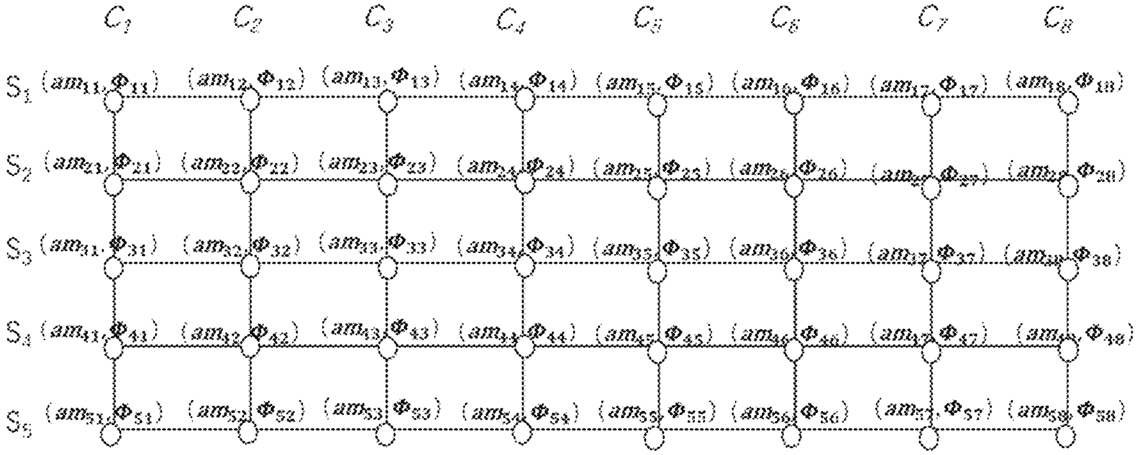
FIG. 11 is a schematic diagram illustrating exemplary RF parameters for a plurality of slices according to some embodiments of the present disclosure.

For example, as illustrated in FIG. 11, taking slice S1 as an example, ($am_{11}$, $\phi_{11}$) refers to the amplitude parameter and the phase parameter of channel C1 for exciting slice S1, ($am_{12}$, $\phi_{12}$) refers to the amplitude parameter and the phase parameter for the excitation of the slice S1 by the channel C2; ($am_{13}$, $\phi_{13}$) refers to the amplitude parameter and the phase parameter for the excitation of slice S1 by channel C3. Accordingly, the excitation power of each channel for exciting slice S1 may be determined based on the corresponding phase parameter and the amplitude parameter. For example, an excitation power of channel C1 for exciting slice S1 may be determined based on ($am_{11}$, $\phi_{11}$); an excitation power of channel C2 for exciting slice S1 may be determined based on ($am_{12}$ $\phi_{12}$), etc.

In some embodiments, for each slice, the processing device 120 may determine attribute information of RF signals for exciting the slice based on RF parameters corresponding to the slice. Take a specific channel as an example, the attribute information of RF signals may include, for example, amplitude information of the RF signals, the phase information of the RF signals, a count of groups of the RF signals, or the like, or any combination thereof. Further, the processing device 120 may determine the excitation power of each channel for exciting the slice based on the attribute information of RF signals.

In 1020, the processing device 120 (e.g., the second determination module 420) may determine a slice group from the plurality of slices based on the excitation powers of the plurality of channels for exciting the plurality of slices.

In some embodiments, take a specific channel as an example, the processing device 120 may determine two or more slices that the channel can excite based on the excitation powers of the channel for exciting the plurality of slices and a power attribute (e.g., a power threshold for the channel, a total power threshold for the plurality of channels) associated with the channel.

In some embodiments, when determining the slice group, the processing device 120 may consider excitation effects corresponding to the slices, imaging quality, etc. Accordingly, the processing device 120 may determine the first slice to be excited based on the excitation powers of the plurality of channels for exciting the plurality of slices and the power attributes of the plurality of channels. The processing device 120 may further determine, for each channel, a power difference between a power threshold of the channel and an excitation power of the channel for exciting the first slice. In response to determining that the power difference is enough for exciting at least one other slice, the channel may be used to excite the first slice and one or more other slices at the same time. For example, the processing device 120 may determine a slice group including the first slice and at least one candidate first slice. In some embodiments, the processing device 120 may determine a plurality of slice groups for a plurality of excitations.

Figure 12:
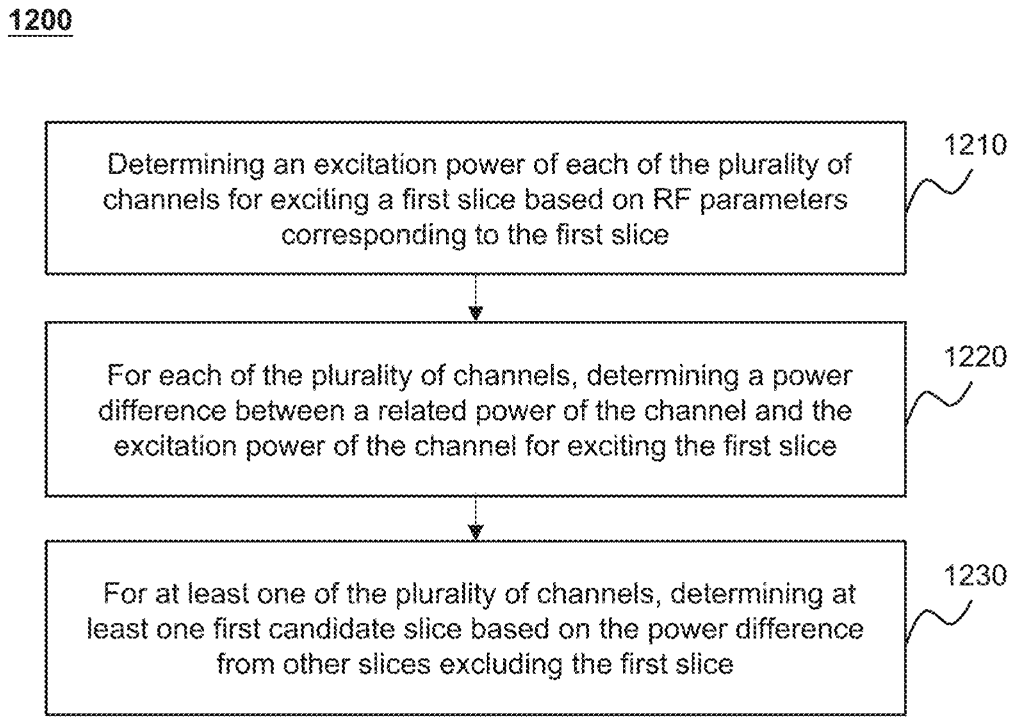
FIG. 12 is a flowchart illustrating an exemplary process for determining a slice group according to some embodiments of the present disclosure.

FIG. 12 is a flowchart illustrating an exemplary process for determining a slice group according to some embodiments of the present disclosure. In some embodiments, operation 1020 of process 1000 may be performed based on process 1200.

In 1210, the processing device 120 (e.g., second determination module 420) may determine an excitation power of each of the plurality of channels for exciting a first slice based on RF parameters corresponding to the first slice.

For illustration purposes, the following table 1 is provided for illustrating exemplary excitation powers of the plurality of channels for exciting the plurality of slices.

TABLE 1

| excitation power of each channel for exciting the slices | | | | | | | | |
|---|---|---|---|---|---|---|---|---|
| Power | C1 (10 W) | C2 (6 W) | C3 (8 W) | C4 (7 W) | C5 (9 W) | C6 (7 W) | C7 ( 11 W) | C8 ( 12 W) |
| S1 | **6 W** | **6 W** | 7 W | 5 W | 4 W | **6 W** | **8 W** | 6 W |
| S2 | 4 W | 3 W | 5 W | 7 W | **7 W** | 3 W | 7 W | 6 W |
| S3 | 5 W | 4 W | **8 W** | 8 W | 9 W | 8 W | 5 W | **7 W** |
| S4 | 7 W | 5 W | 4 W | **6 W** | 5 W | 5 W | 6 W | 5 W |
| S5 | 6 W | 7 W | 7 W | 5 W | 7 W | 4 W | 4 W | 7 W |

As shown in Table 1, C1, C2, C3, C4, C5, C6, C7, and C8 represent the plurality of channels; S1, S2, S3, S4, and S5 represent the plurality of slices. The rated powers (also referred to as "power thresholds") of the channels are shown in corresponding parentheses. For example, the rated power of C1 is 10 W; the rated power of C2 is 6 W; the rated power of C3 is 8 W; the rated power of C4 is 7 W; the rated power of C5 is 9 W; the rated power of C6 is 7 W; the rated power of C7 is 11 W; the rated power of C8 is 12 W.

In some embodiments, for each of the plurality of channels, the processing device 120 may determine a corresponding first slice based on an exciting effect, an imaging effect, excitation powers of the channel for exciting the plurality of slices respectively, the rated power of the channel, etc. For example, the processing device 120 may determine slice S1 as the first slice for channel C1; determine slice S1 as the first slice for channel C2; determine slice S3 as the first slice for channel C3; determine slice S4 as the first slice for channel C4; determine slice S2 as the first slice for channel C5; determine slice S1 as the first slice for channel C6; determine slice S1 as the first slice for channel C7; determine slice S3 as the first slice for channel C8. As shown in Table 1, the excitation power of the first slice corresponding to each channel is bolded and underlined.

In 1220, for each of the plurality of channels, the processing device 120 (e.g., the second determination module 420) may determine a power difference between a related power (or the power threshold) of the channel and the excitation power of the channel for exciting the first slice.

Referring to Table 1, the processing device 120 may determine that: the power difference between the rated power of channel C1 and the excitation power for exciting slice S1 is 4 W; the power difference between the rated power of channel C2 and the excitation power for exciting slice S1 is OW; the power difference between the rated power of channel C3 and the excitation power for exciting slice S3 is OW; the power difference between the rated power of channel C4 and the excitation power for exciting slice S4 is 1 W; the power difference between the rated power of channel C5 and the excitation power for exciting slice S2 is 2 W; the power difference between the rated power of channel C6 and the excitation power for exciting slice S1 is 1 W; the power difference between the rated power of channel C7 and the excitation power for exciting slice S1 is 3 W; the power difference between the rated power of channel C8 and the excitation power for exciting slice S3 is 5 W.

In 1230, for at least one of the plurality of channels, the processing device 120 (e.g., the second determination module 420) may determine at least one first candidate slice based on the power difference from other slices excluding the first slice. For the at least one first candidate slice, the excitation power should be less than or equal to the power difference.

In some embodiments, for each channel, the processing device 120 may compare the power difference with the excitation powers of the channel for exciting other slices excluding the first slice. In response to determining that other slices include at least one slice that corresponds to an excitation power less than or equal to the power difference, the at least one slice may be determined as the at least one first candidate slice. For example, with reference to Table 1, the processing device 120 may determine slice S2 as the first candidate slice for channel C1, accordingly, channel C1 may be used to excite slice S1 and slice S2 concurrently. As another example, the processing device 120 may determine slice S4 as the first candidate slice for channel C8, accordingly, channel C8 may be used to excite slice S3 and slice S4 concurrently.

In 1240, the processing device 120 (e.g., e.g., the second determination module 420) may determine a slice group based on the first slice and the at least one first candidate slice. For example, the processing device 120 may determine a slice group including the first slice and the at least one first candidate slice.

According to the embodiments of the present disclosure, in an excitation, slices of the slice group are excited concurrently. For some channels, a single channel is used to excite two or more slices. In conventional MRI imaging, the plurality of channels is used to excite a single slice in a single excitation. For instance, in a first excitation, channels C1-C8 are used to excite slice S1. In a second excitation, channels C1-C8 are used to excite slice S2. Compared to the conventional MRI imaging, the methods and systems provided in the present disclosure may allow two or more slices to be excited in a single excitation, which may reduce the number of excitations for the subject and reduce the time needed for the excitations. Thus, the imaging efficiency of the MRI scan and the image quality of an image obtained by the MRI scan may be improved.

Figure 13:
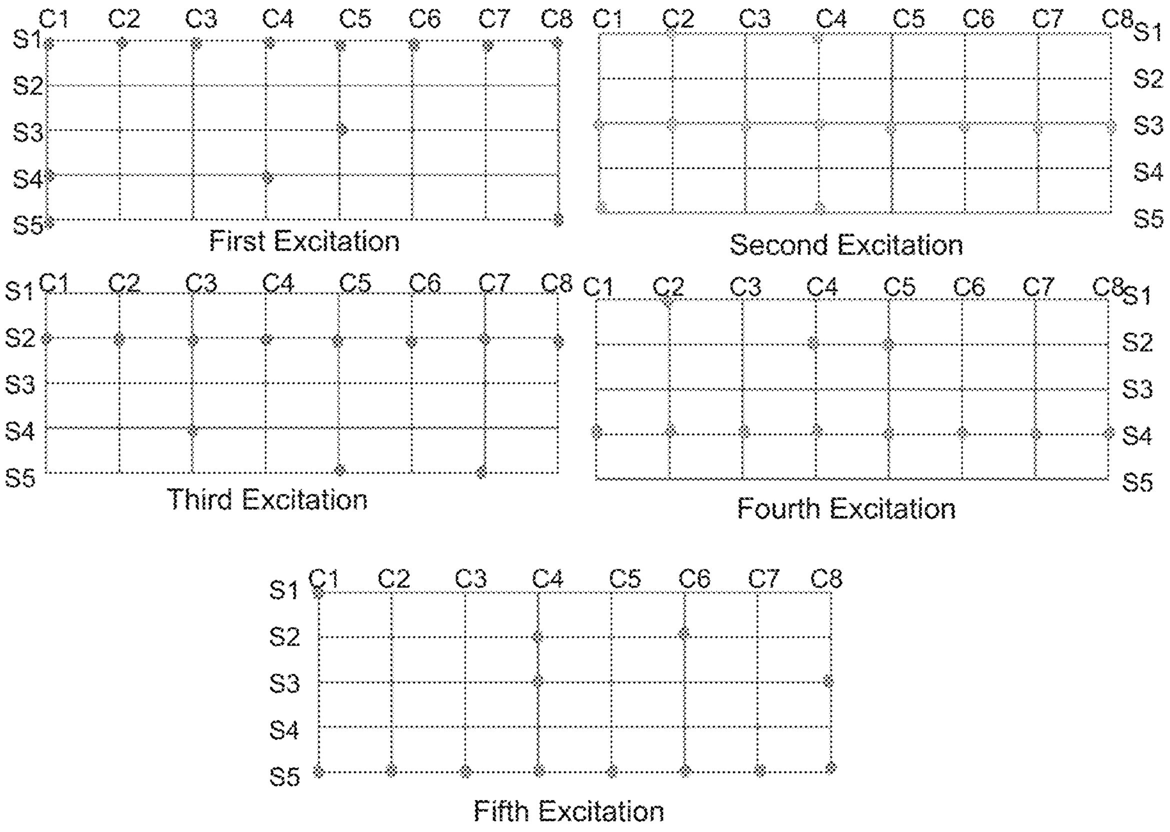
FIG. 13 is a schematic diagram illustrating exemplary excitations of a plurality of slices according to some embodiments of the present disclosure.

FIG. 13 is a schematic diagram illustrating exemplary excitations of a plurality of slices according to some embodiments of the present disclosure.

As shown in FIG. 13, in the first excitation, slice S1 is determined as the first slice and the eight channels C1-C8 are all initiated. Then for each of the eight channels, the processing device 120 may determine a power difference between a power threshold of the channel and an excitation power of the channel for exciting the first slice (i.e., slice S1). Further, for at least one of the eight channels, the processing device 120 may determine at least one first candidate slice based on the power difference. For example, for channel C1, first candidate slices S4 and S5 are determined; for channel C4, a first candidate slice S4 is determined; for channel C5, a first candidate slice S3 is determined; for channel C8, a first candidate slice S5 is determined. Accordingly, slices S1, S3, S4, and S5 are determined as a slice group and are excited concurrently in the first excitation.

Similarly, in the second excitation, slice S3 is determined as the first slice and the eight channels C1-C8 are all initiated. For channel C1, a first candidate slice S5 is determined; for channel C2, a first candidate slice S1 is determined; for channel C4, first candidate first slices S1 and S5 are determined. For some channels (e.g., C3, C5, C6), since the power difference between the rated power of the channel and the excitation power for exciting slice S3 is not enough for exciting other slices, the channel is directed to excite only slice S3 in the second excitation. Accordingly, slices S1, S3, and S5 are determined as a second group and are excited concurrently in the second excitation. Similarly, the slice group corresponding to the third excitation may include slices S2, S4, and S5. The slice group corresponding to the fourth excitation may include slices S1, S2, and S4. The slice group corresponding to the fifth excitation may include slices S1, S2, S3, and S5.

It should be noted that FIG. 13 is merely provided for illustration purposes and is not intended to be limiting.

Figure 14:
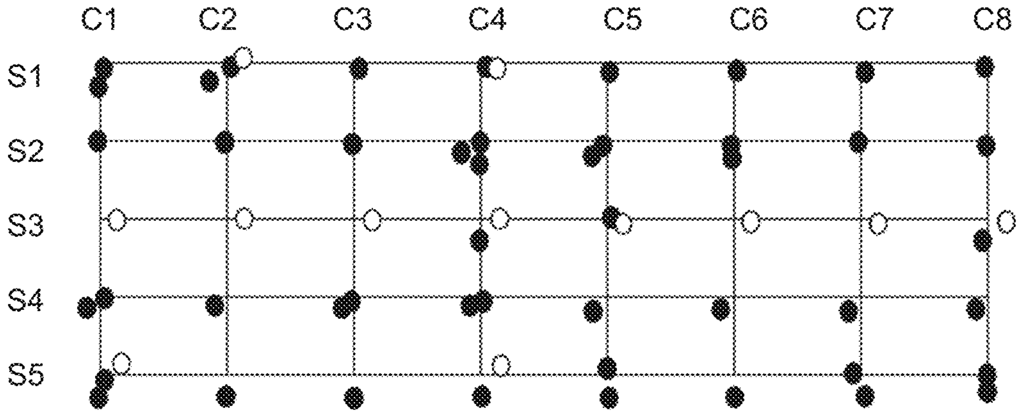
FIG. 14 is a schematic diagram illustrating an exemplary accumulated excitation result of the excitations illustrated in FIG. 13 according to some embodiments of the present disclosure.

FIG. 14 is a schematic diagram illustrating an exemplary accumulated excitation result of the excitations illustrated in FIG. 13 according to some embodiments of the present disclosure.

As shown in FIG. 14, after five excitations, each of the slices S1-S5 is excited by more than one time. For example, slice S1 is excited by channel C1 twice, by channel C2 three times, by channel C3 one time, by channel C4 twice, by channels C4-C8 one time. As compare to some conventional MRI imaging techniques (e.g., a slice is excited by a channel only once), the excitation efficiency is higher for the systems and methods provided in the present disclosure, thereby improving the imaging efficiency and quality of an image obtained based on the excitations.

Figure 15:
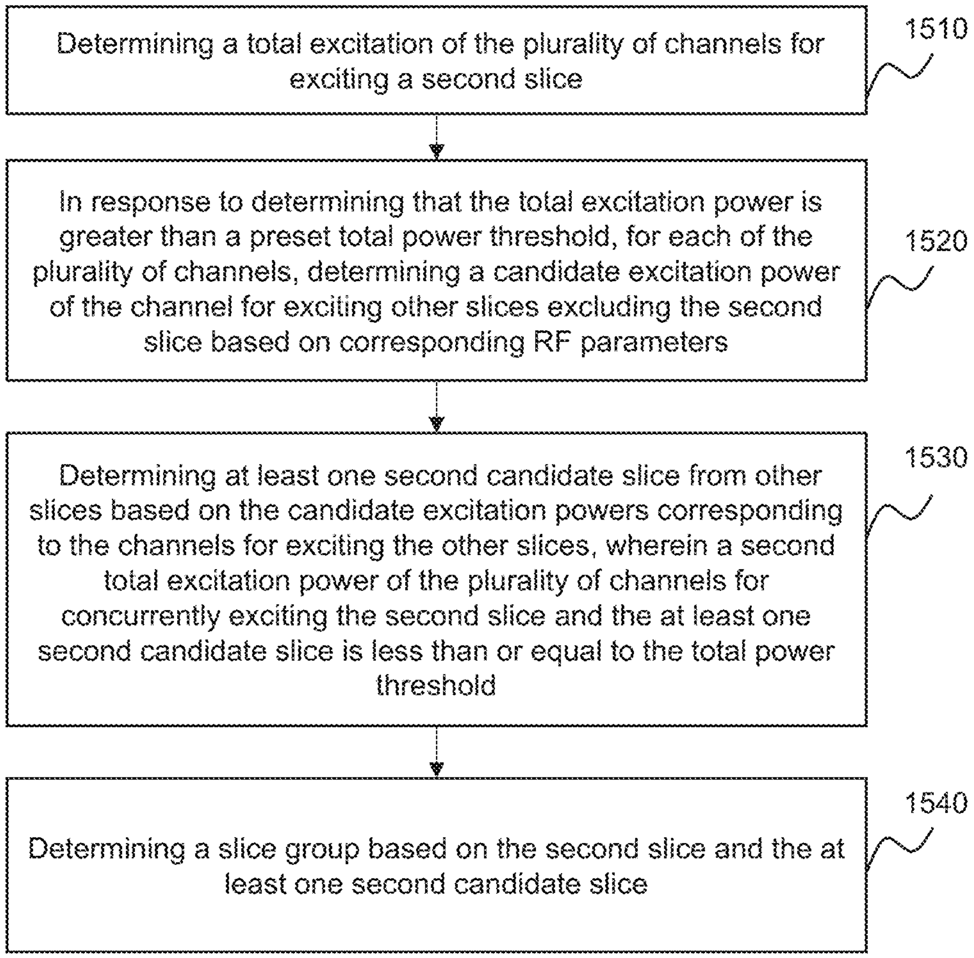
FIG. 15 is a flowchart illustrating an exemplary process for determining a slice group according to some embodiments of the present disclosure.

FIG. 15 is a flowchart illustrating an exemplary process for determining a slice group according to some embodiments of the present disclosure. In some embodiments, operation 1020 of process 1000 may be performed based on process 1200.

In 1510, the processing device 120 (e.g., the second determination module 420) may determine a total excitation power (also referred to as "first total excitation power") of the plurality of channels for exciting a second slice.

In some embodiments, the processing device 120 may determine attribute information of RF signals of each channel for exciting the second slice based on RF parameters corresponding to the second slice. The processing device 120 may further determine the excitation power of each channel for exciting the second slice and determine the total excitation power based on a sum of the excitation powers of the channels for exciting the second slice.

For example, as shown in Table 1 above, it is assumed that slice S1 is determined as the second slice, the total excitation power of channels C1-C8 for exciting slice S1 is 48 W.

In 1520, in response to determining that the total excitation power is greater than a preset total power threshold, for each of the plurality of channels, the processing device 120 (e.g., the second determination module 420) may determine a candidate excitation power of the channel for exciting other slices excluding the second slice based on corresponding RF parameters.

In some embodiments, the total power threshold may be determined based on attribute information of the subject to be scanned, such as age, gender, weight, height, body thickness, body width, health conditions, or the like, or any combination thereof. For instance, the preset total power threshold may be 38 W, 40 W, 42 W, etc., which is not limited by the present disclosure.

If the total excitation power is less than or equal to the total power threshold, it may indicate that the maximum excitation power that the subject can bear is greater than or equal to the total excitation power. Accordingly, all the plurality of channels can be used to excite the second slice. However, if the total excitation power is greater than the total power threshold, it may indicate that the maximum excitation power that the subject can bear is less than the total excitation power (i.e., the subject can't bear that all the plurality of channels excite the second slice). For instance, with reference to Table 1 above, it is assumed that slice S1 is determined as the second slice, the total excitation power of channels C1-C8 for exciting slice S1 is 48 W. If the total power threshold is 45 W, the total excitation power of 48 W is greater than the total power threshold. Accordingly, all the plurality of channels can't be used to excite the second slice. In this situation, the processing device 120 may determine a candidate excitation power of each channel for exciting other slices excluding the second slice based on corresponding RF parameters.

In 1530, the processing device 120 (e.g., the second determination module 420) may determine at least one second candidate slice from other slices based on the candidate excitation powers corresponding to the channels for exciting the other slices, wherein a second total excitation power of the plurality of channels for concurrently exciting the second slice and the at least one second candidate slice is less than or equal to the total power threshold.

For example, with reference to Table 1, it is assumed that slice S1 is determined as the second slice, the total excitation power (48 W) of channels C1-C8 for exciting slice S1 is larger than the total power threshold (45 W). Accordingly, for channel C6 and channel C7, the processing device 120 may determine slice S2 as a second candidate slice. Accordingly, in an excitation, channels C1-C5 and C8 may be used to excite slice S1, and channels C6 and C7 may be used to excite the slice S2. The second total excitation power for exciting slice S1 and slice S2 is 44 W, which is lower than the total power threshold of 45 W.

In 1540, the processing device 120 (e.g., the second determination module 420) may determine a slice group based on the second slice and the at least one second candidate slice. For example, the processing device 120 may determine a slice group including the second slice and the at least one second candidate slice.

According to the embodiments of the present disclosure, by controlling the total excitation power for the excitation of a slice to be less than or equal to the total power threshold, the subject to be scanned may be better protected. Moreover, when the total excitation power for the excitation of the slice exceeds the total power threshold, by directing one or more channels to excite at least one other slice concurrently with the slice, full advantage may be taken of the plurality of channels. Thus, imaging efficiency may be improved.

Figure 16:
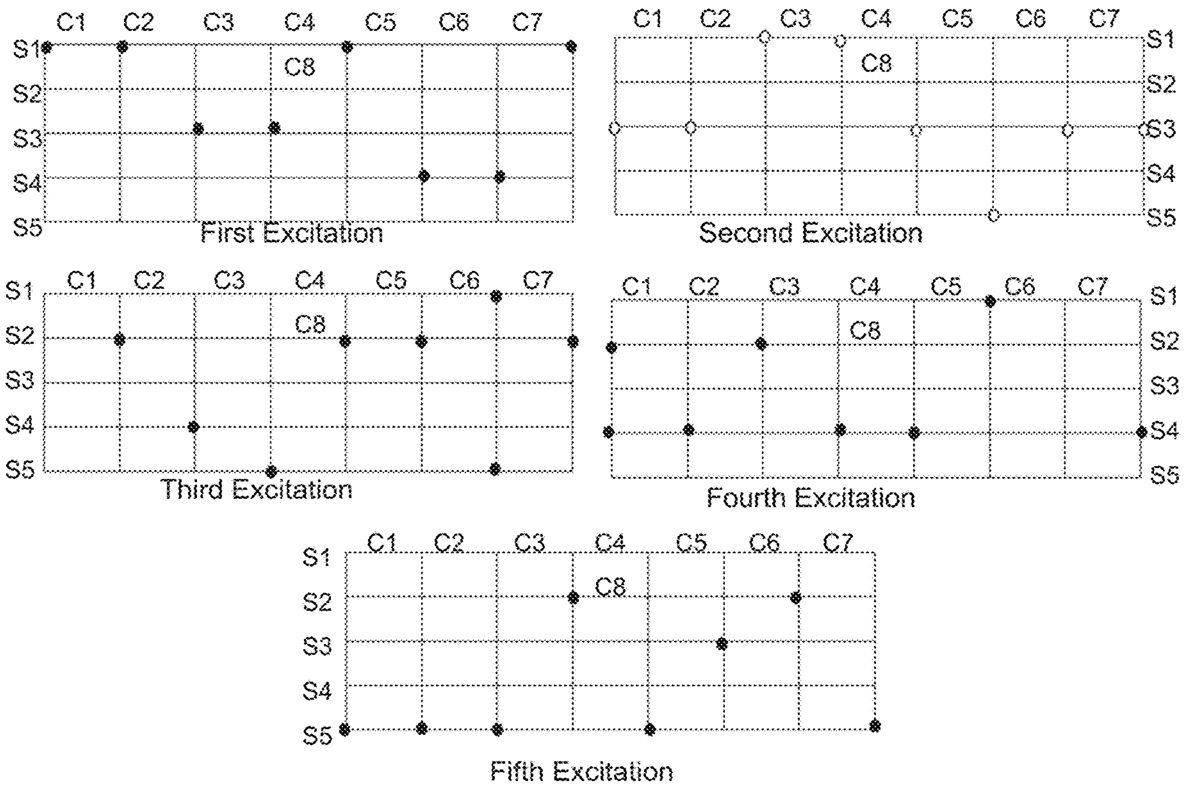
FIG. 16 is a schematic diagram illustrating exemplary excitations of a plurality of slices of the subject according to some embodiments of the present disclosure.

FIG. 16 is a schematic diagram illustrating exemplary excitations of a plurality of slices of the subject according to some embodiments of the present disclosure.

As shown in FIG. 16, in the first excitation, slice S1 is determined as the second slice and a total excitation power of the eight channels C1-C8 for exciting slice S1 is larger than a total power threshold. Accordingly, for channel C3 and C4, the processing device 120 determines slice S3 as a second candidate slice; for channel C6 and C7, the processing device 120 determines slice S4 as a second candidate slice. In this situation, a total excitation power of the eight channels C1-C8 for exciting slices S1, S3, and S4 is less than the total power threshold. Accordingly, slices S1, S3, and S4 are determined as a slice group and excited concurrently by the eight channels C1-C8 in the first excitation, wherein one channel only excites one slice. Specifically, channel C1, C2, C5, C6, and C8 excite slice S1; channel C3 and C4 excite slice S3; channel C6 and C7 excite slice S4.

Similarly, as shown in FIG. 16, the slice group corresponding to the second excitation may include slices S1, S3, and S5. The slice group corresponding to the third excitation may include slices S1, S2, S4, and S5. The slice group corresponding to the fourth excitation may include slices S1, S2, and S4. The slice group corresponding to the fifth excitation may include slices S2, S3, and S5. In each excitation shown in FIG. 16, each of the plurality of channels is used to excite one slice of the slice group.

It should be noted that FIG. 16 is merely provided for illustration purposes and is not intended to be limiting.

Figure 17:
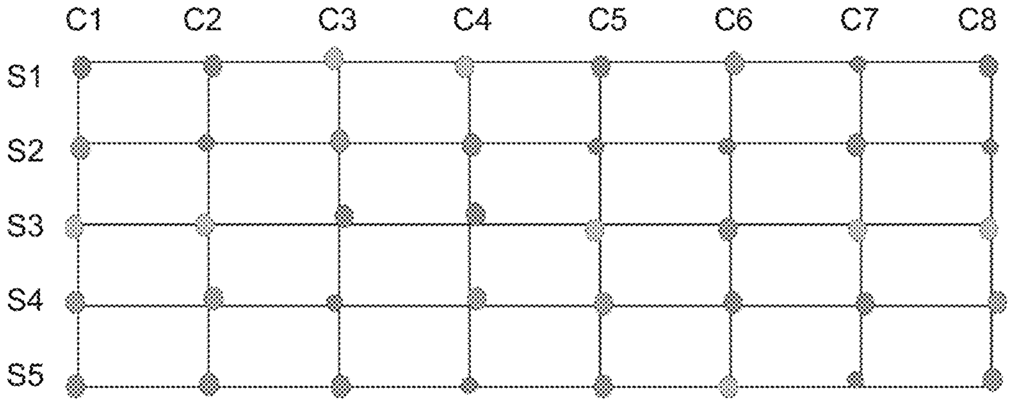
FIG. 17 is a schematic diagram illustrating an exemplary accumulated excitation result of the excitations illustrated in FIG. 16 according to some embodiments of the present disclosure.

FIG. 17 is a schematic diagram illustrating an exemplary accumulated excitation result of the excitations illustrated in FIG. 16 according to some embodiments of the present disclosure.

As shown in FIG. 17, after five excitations, each of slices S1-S5 is excited by all the channels. Each channel of channels C1-C8 is used to excite each slice of slices S1-S5 once in the five excitations. In conventional MRI imaging techniques, when the total excitation power of channels C1-C8 for exciting slice S1 exceeds the total power threshold, only a portion of channels C1-C8 may be used for exciting slice S1 so as to ensure the total excitation power for exciting slice S1 is less than or equal to the total power threshold. Compared to these traditional MRI imaging techniques, slice S1 may receive a higher excitation power in the excitations according to some embodiments of the present disclosure, which may improve the imaging efficiency and the imaging quality.

Figure 18:
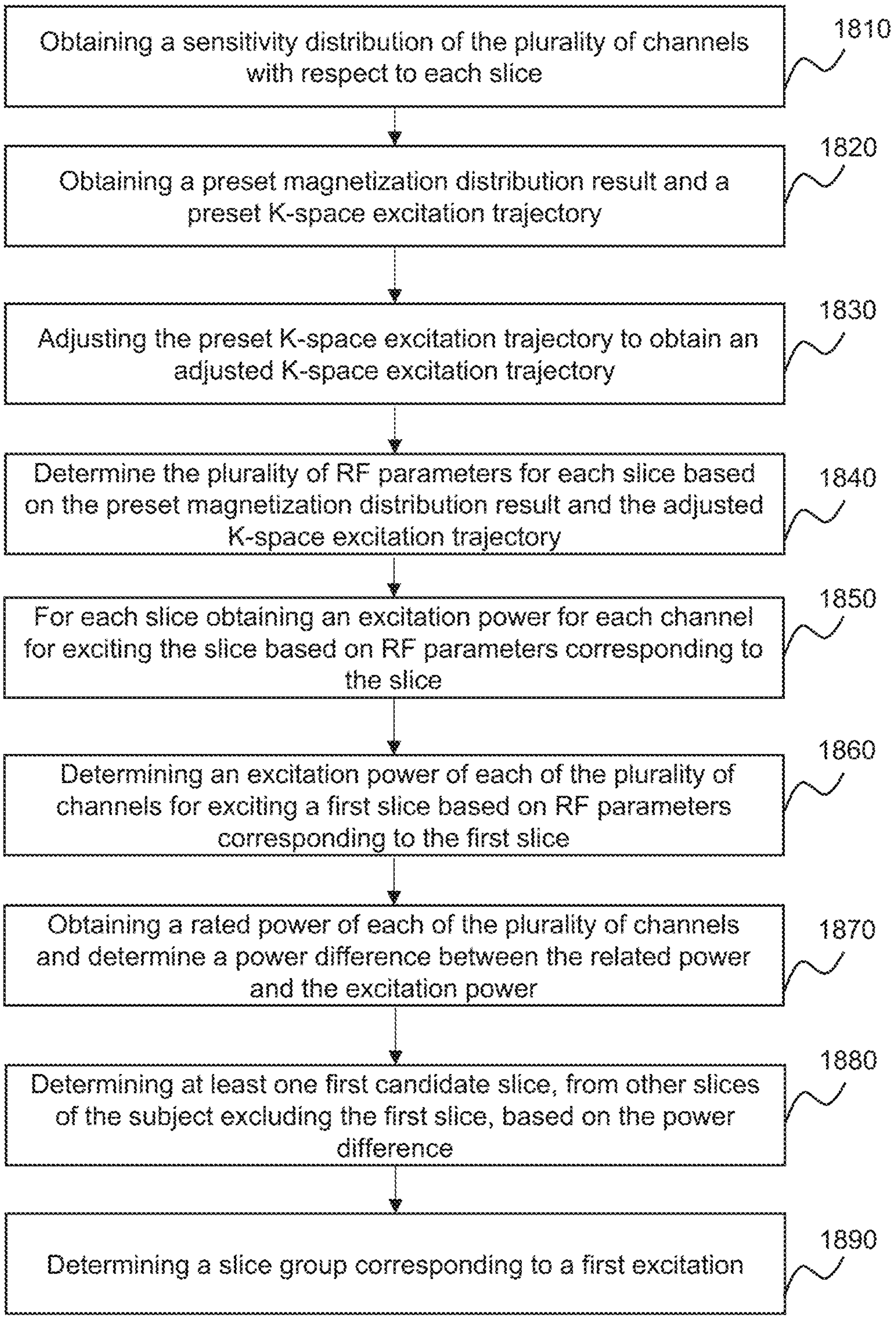
FIG. 18 is a flowchart illustrating an exemplary process for determining a slice group according to some embodiments of the present disclosure.

FIG. 18 is a flowchart illustrating an exemplary process for determining a slice group according to some embodiments of the present disclosure.

In 1810, the processing device 120 (e.g., the second determination module 420) may obtain a sensitivity distribution of the plurality of channels with respect to each slice.

In 1820, the processing device 120 (e.g., the second determination module 420) may obtain a preset magnetization distribution result and a preset K-space excitation trajectory.

In 1830, the processing device 120 (e.g., the second determination module 420) may obtain an adjusted K-space excitation trajectory by adjusting the preset K-space excitation trajectory.

In 1840, the processing device 120 (e.g., the second determination module 420) may determine the plurality of RF parameters for each slice based on the preset magnetization distribution result and the adjusted K-space excitation trajectory.

In 1850, for each slice, the processing device 120 (e.g., the second determination module 420) may obtain an excitation power of each channel for exciting the slice based on RF parameters corresponding to the slice.

In 1860, the processing device 120 (e.g., the second determination module 420) may determine an excitation power of each channel for exciting a first slice based on RF parameters corresponding to the first slice, wherein a total excitation power of the plurality of channels for exciting the first slice is less than or equal to a total power threshold. Additionally or alternatively, a sum of the amplitude parameters of the plurality of channels may be less than a first limiting value, and/or a sum of the phase parameters of the plurality of channels may be less than a second limiting value.

In 1870, the processing device 120 (e.g., the second determination module 420) may obtain a rated power of each of the plurality of channels and determine a power difference between the related power and the excitation power of the channel for exciting the first slice.

In 1880, the processing device 120 (e.g., the second determination module 420) may determine at least one first candidate slice from other slices excluding the first slice based on the power difference. In some embodiments, a total excitation power for exciting the first slice and the at least one first candidate slice may be close to or may reach the total power threshold. Additionally or alternatively, a sum of the amplitude parameters of the plurality of channels for exciting the first slice and the at least one first candidate slice may be close to or may reach a first limiting value, and/or a sum of the phase parameters of the plurality of channels for exciting the first slice and the at least one first candidate slice may be close to or may reach a second limiting value.

In 1890, the processing device 120 (e.g., the second determination module 420) may determine a slice group corresponding to a first excitation.

Similarly, for a second slice to be excited, the processing device 120 may perform operations 1860-1890 to obtain a slice group corresponding to a second excitation; for a third slice to be excited, the processing device 120 may perform operations 1860-1890 to obtain a slice group corresponding to a third excitation; etc.

In some embodiments, for each slice to be excited, the processing device 120 may determine a power parameter of the channels for exciting the slice. The power parameter may include a local SAR, a global SAR, a total excitation power, or the like, or any combination thereof. The processing device 120 may determine whether the power parameter corresponding to each slice is less than or equal to a corresponding threshold. In response to determining that the power parameter is less than or equal to the corresponding threshold, the plurality of channels may be used to excite the plurality of slices according to a certain excitation order. In response to determining that power parameter(s) corresponding to one or more slices are greater than the corresponding threshold, the RF parameters corresponding to the one or more slices may be divided into multiple groups of RF parameters, thereby obtaining multiple groups of excitation sequences each of which can be used to concurrently excite two or more slices and corresponding power parameter(s) would be less than or equal to the corresponding threshold.

In some embodiments, if a total excitation power for exciting slice 1 is greater than a total excitation power for exciting slice 2, and/or an estimated SAR corresponding to slice 1 is greater than a preset SAR, the processing device 120 may determine a channel A corresponding to the highest excitation power for exciting slice 1 and a channel B corresponding to the highest excitation power for exciting slice 2. In an excitation, the processing device 120 may direct other channels excluding channel A to excite slice 1 and direct channel B to excite slice 2. In another excitation, the processing device 120 may direct channel A to excite slice 2 and direct other channels excluding channel B to excite slice 1. In this way, the SAR and/or the total excitation power corresponding to slice 1 can be decreased.

Figure 19:
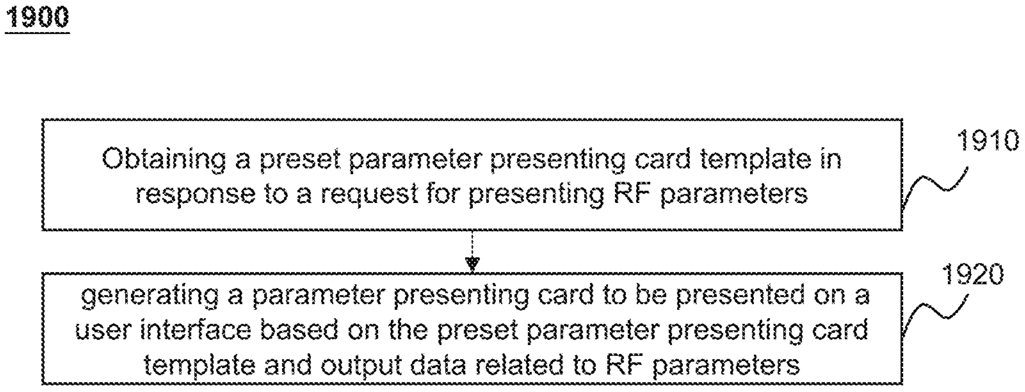
FIG. 19 is a flowchart illustrating an exemplary process for presenting output data related to at least a part of channel parameters according to some embodiments of the present disclosure.

FIG. 19 is a flowchart illustrating an exemplary process for presenting output data related to at least a part of channel parameters according to some embodiments of the present disclosure.

In 1910, the processing device 120 (e.g., the presenting module 440) may obtain a preset parameter presenting card template in response to a request for presenting RF parameters associated with channels.

In some embodiments, the preset parameter presenting card template may include data columns of all channels and RF clock data columns corresponding to each channel.

In 1920, the processing device 120 (e.g., the presenting module 440) may generate a parameter presenting card to be presented on a user interface based on the preset parameter presenting card template and output data related to RF parameters (or output data related to RF signals).

In some embodiments, the processing device 120 may use a visualization tool to obtain output data related to RF parameters (e.g., specific values) and fill the preset parameter presenting card template using the output data related to the RF parameters. The parameter presenting card may be displayed on a user interface, such as a graphical interface on the terminal device 300.

Figure 20:
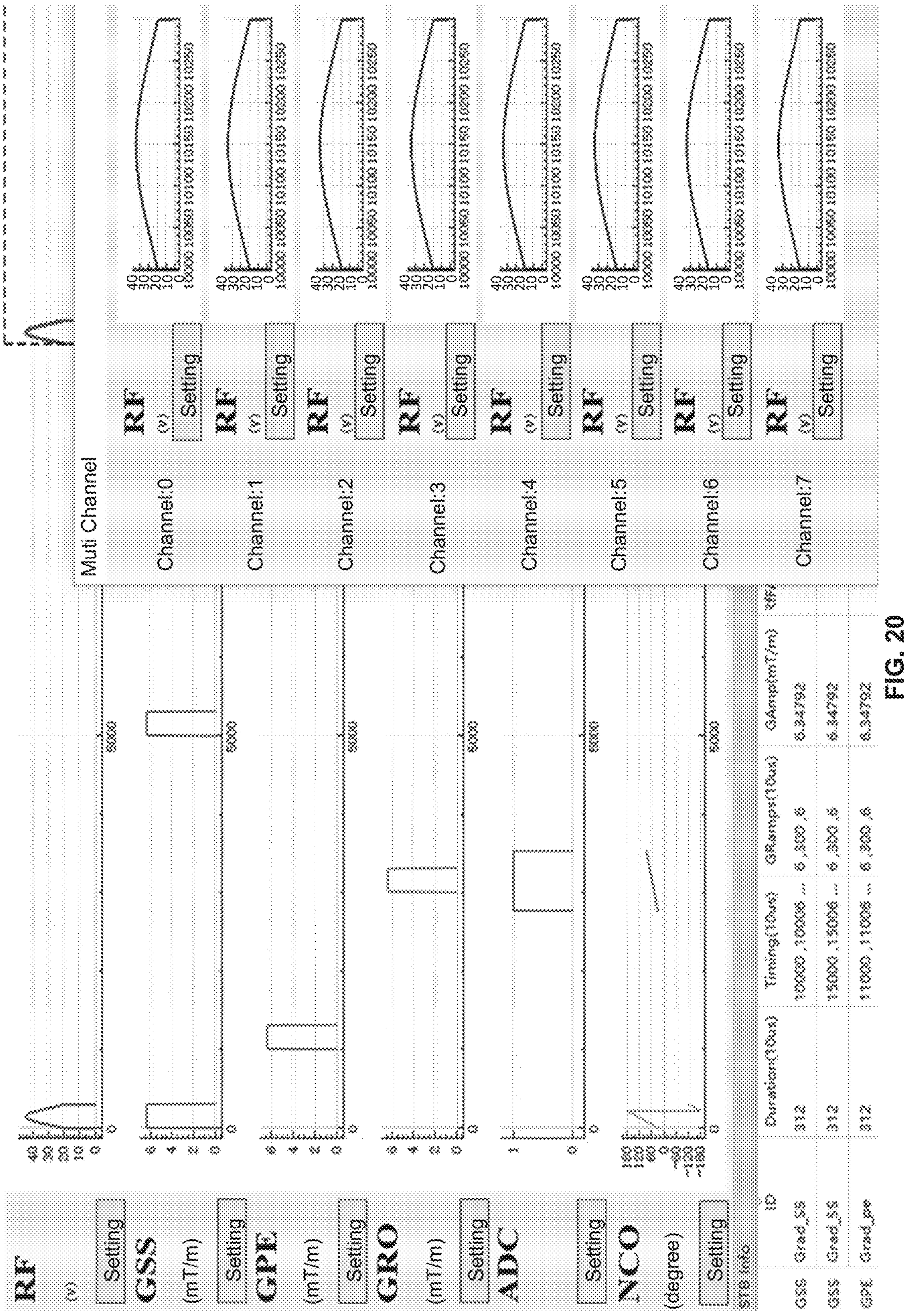
FIG. 20 is a schematic diagram illustrating an exemplary graphical interface for presenting output data related to RF parameters according to some embodiments of the present disclosure.

For example, as illustrated in FIG. 20, the parameter presenting card is presented on the graphical interface. The parameter presenting card indicates eight channels (i.e., channel 0-channel 7). For each channel, a waveform corresponding to the RF signals of the channel is presented. Numerically controlled oscillator (NCO) RF clock data is also presented. It can be seen that the waveforms and the NCO data corresponding to the eight channels can be concurrently presented. In some embodiments, since the channels can be independently controlled for exciting the subject to be scanned, the output data of the RF signals of the channels and the NCO data may be the same or different.

In some embodiments, the parameter presenting card may be displayed on a top layer of the graphical interface. The location of the parameter presenting card may be changed according to a user instruction. For example, a user may drag the parameter presenting card using a mouse, via a touch screen, etc. In some embodiments, the parameter presenting card may be embedded into the graphical interface or in other forms.

In some embodiments, output data related to the plurality of channels may be presented in a partially folded form. For example, a mark (e.g., an RFID) and output data related to at least one channel parameter corresponding to one channel may be presented. The channel may be used to provide an unfold option for presenting output data related to at least one channel parameter corresponding to at least one of other channels. In some embodiments, the channel mark may be any point on the waveform corresponding to the channel. More descriptions may be found elsewhere in the present disclosure, for example, in FIGS. 21-24 and the descriptions thereof.

Figure 21:
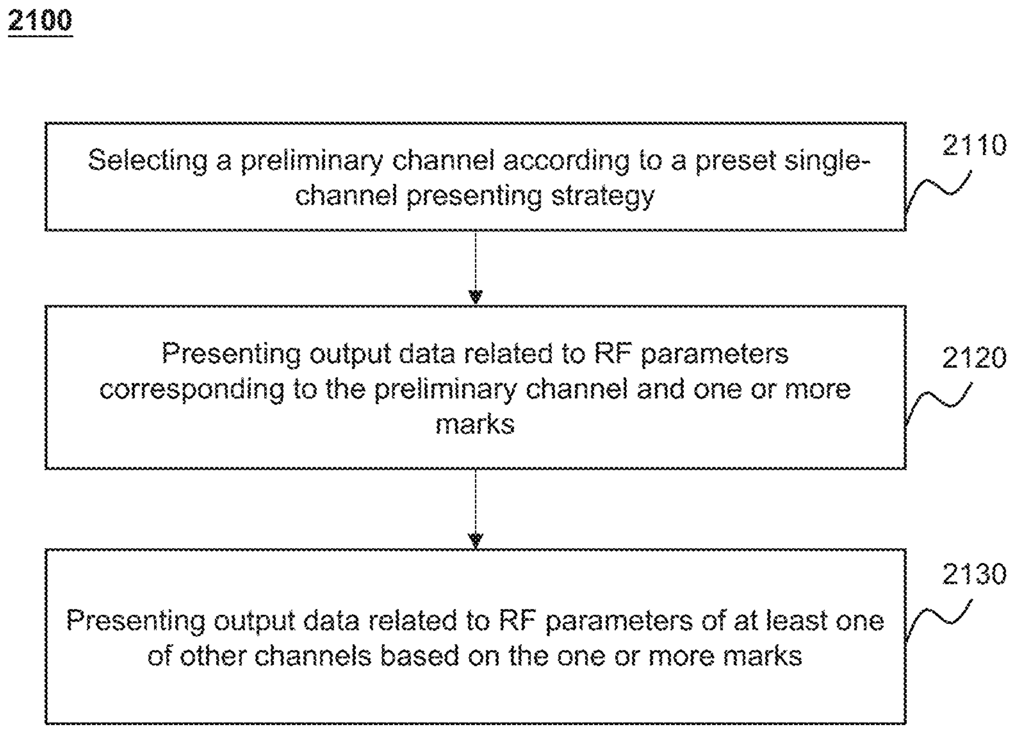
FIG. 21 is a flowchart illustrating an exemplary process for presenting output data related to channel parameters of at least one channel according to some embodiments of the present disclosure.

FIG. 21 is a flowchart illustrating an exemplary process for presenting output data related to channel parameters of at least one channel according to some embodiments of the present disclosure.

In 2110, the processing device 120 (e.g., the presenting module 440) may select a preliminary channel according to a preset single-channel presenting strategy. In some embodiments, the processing device 120 may randomly select a channel from the plurality of channels as the preliminary channel. In some embodiments, the processing device 120 may select a channel corresponding to a highest priority as the preliminary channel.

In 2120, the processing device 120 (e.g., the presenting module 440) may present output data related to RF parameters (or RF signals) corresponding to the preliminary channel and one or more marks (e.g., an RFID).

Figure 22:
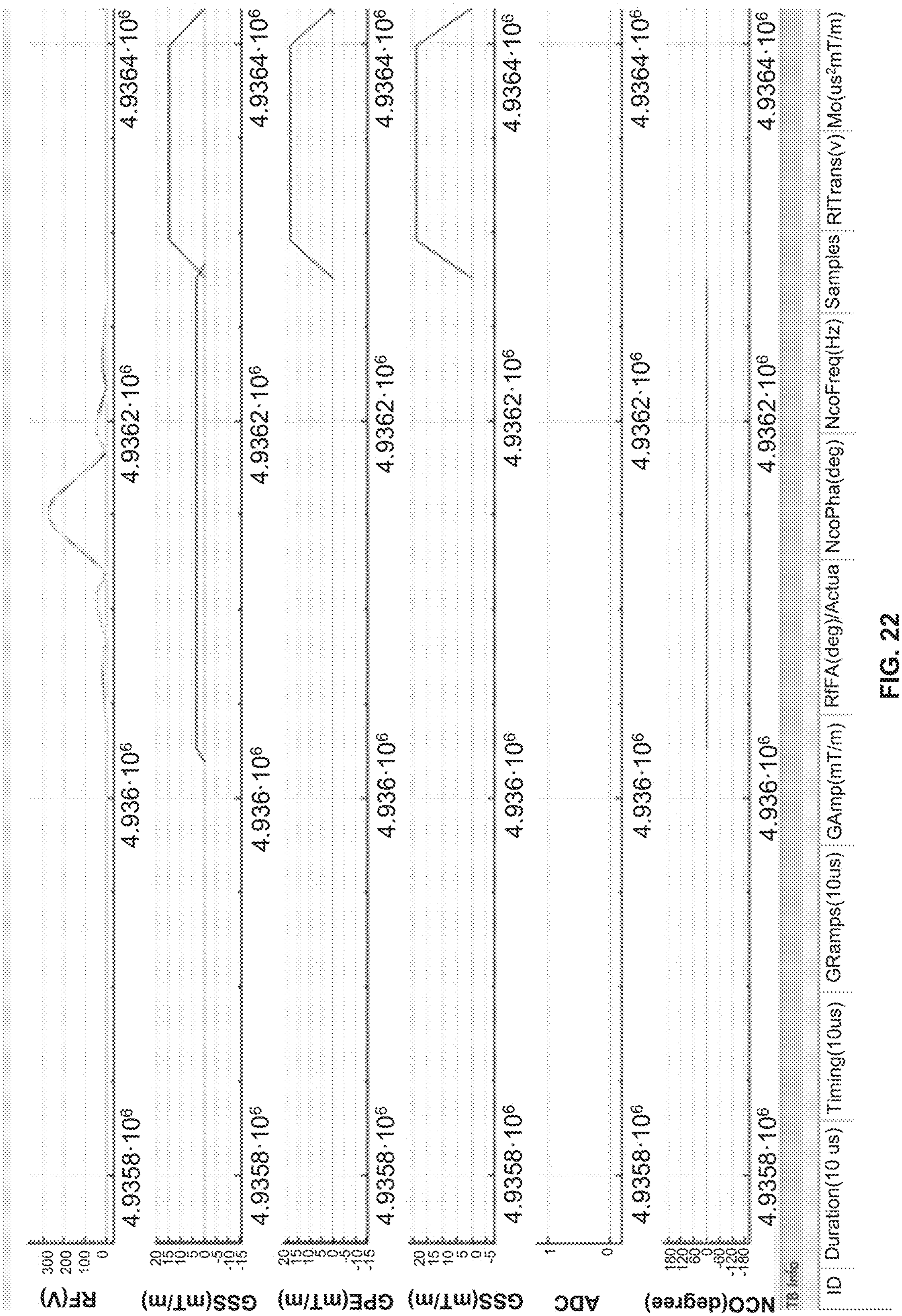
FIG. 22 is a schematic diagram illustrating an exemplary graphical interface for presenting output data related to RF parameters according to some embodiments of the present disclosure.
Figure 24:
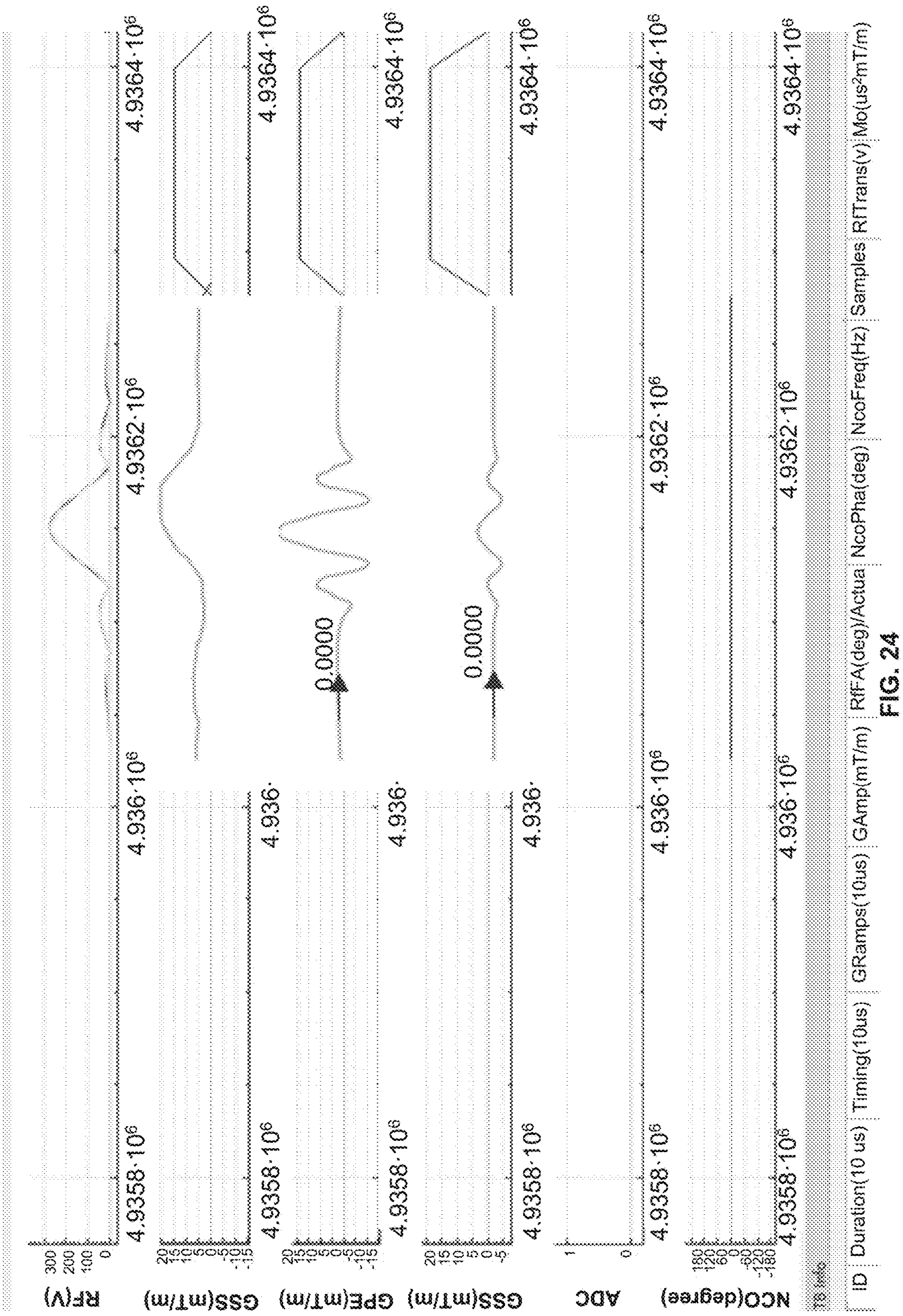
FIG. 24 is a schematic diagram illustrating an exemplary graphical interface for presenting output data related to RF parameters according to some embodiments of the present disclosure.

For example, as shown in FIG. 22, the output data related to the RF signals corresponding to the preliminary channel may include a waveform. In some embodiments, the waveform may be presented with the RFID corresponding to the preliminary channel. The waveform may be presented in a relatively blurry form or may be presented in a colored line, or one or more marks may be presented indicating that there are presentable output data related to RF parameters corresponding to other channels. For example, the one or more marks may include an unfolding mark. The unfolding mark may be presented in the form of a graphic symbol (e.g., an arrow), texts, etc. As anther example, the one or more marks may include one or more RFIDs corresponding to other channels except for the preliminary channel. In some embodiments, output data related to other types of parameters may be presented along with the output data related to the RF parameters of the preliminary channel, such as parameters relating to hardware components (e.g., a gradient module, a signal acquisition module), parameters relating to scanning sequences, etc., which are not limited by the present disclosure. For example, as shown in FIG. 24, a waveform corresponding to the preliminary channel is presented along with output data related to the slice selective gradient (Gss), Phase encoding gradient (Gpe), read out gradient (Gro), apparent diffusion coefficient (ADC) data, etc. In some embodiments, the processing device 120 may direct the terminal device 300 to present a second waveform corresponding to one of other channels by superimposing the second waveform on a first waveform corresponding to the preliminary channel.

In 2130, the processing device 120 (e.g., the presenting module 440) may present output data related to RF parameters of at least one of other channels based on the one or more marks.

Figure 23:
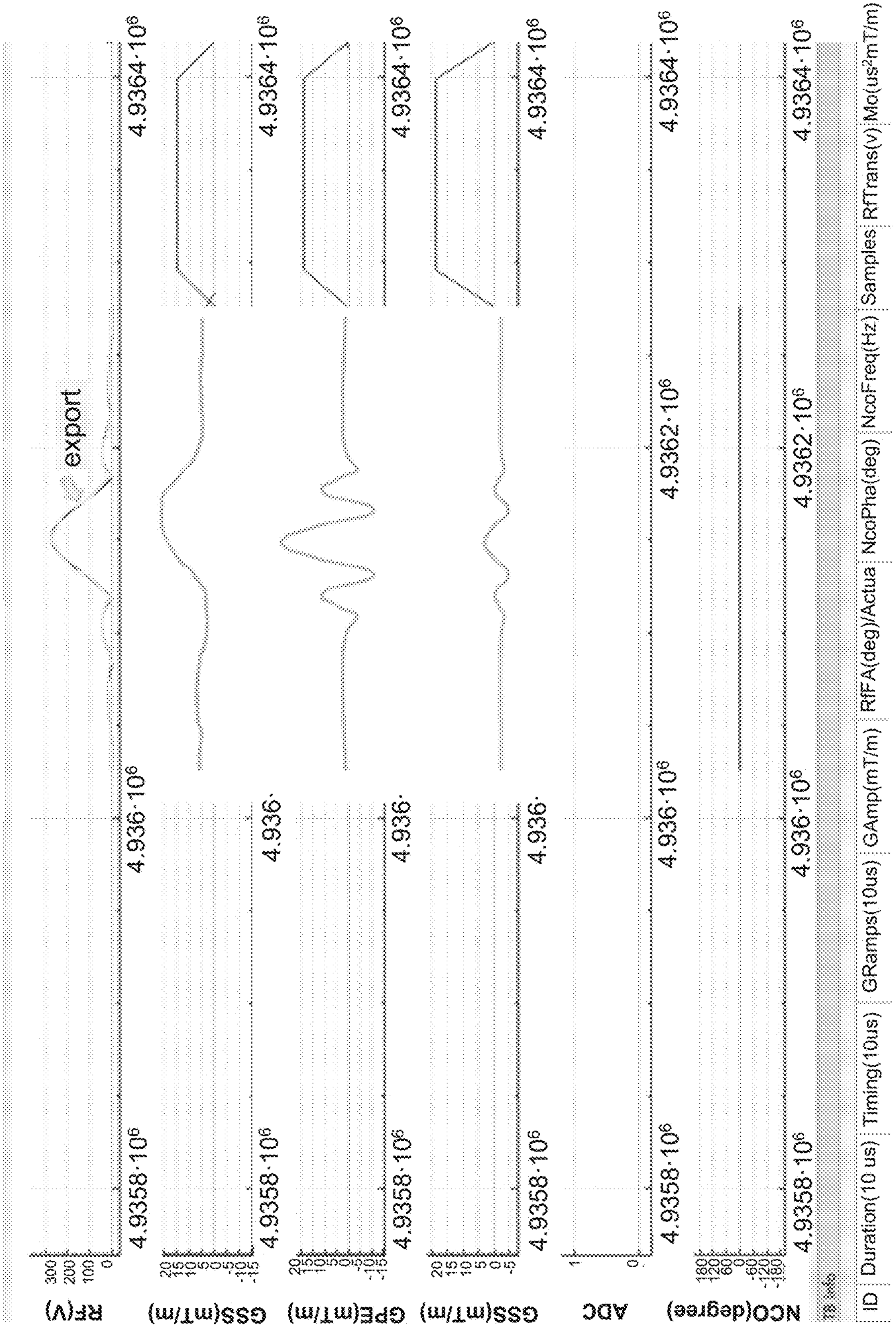
FIG. 23 is a schematic diagram illustrating an exemplary graphical interface for presenting output data related to RF parameters according to some embodiments of the present disclosure.

In some embodiments, the mark presented on the graphical interface may provide an unfold option for presenting output data related to at least one channel parameter corresponding to at least one of other channels. For example, as illustrated in FIG. 23, the user may click the mark using a mouse or touch the mark via a touch screen, accordingly, output data (e.g., waveforms) related to RF parameters of at least one of other channels can be presented.

In some embodiments, as shown in FIG. 24, the user may compare the waveforms corresponding to different channels and add marks such as an arrow. This makes it more convenient for the user to compare the waveforms corresponding to different channels and make an analysis on the waveforms.

With higher requirements on medical images, such as richer details, finer structure detection, and higher image quality, exploration about ultra-high field becomes more and more valuable. However, as the ultra-high field main magnetic field increases, the corresponding radio frequency wavelength will be shortened proportionally, and the unevenness of the emission field B1 will become more significant, causing uneven spatial signal excitation, which in turn leads to uneven signal distribution on resultant images. In order to better optimize and solve this uneven problem, ultra-high fields basically use a multi-channel independent transmitting radio frequency system to support independent modulation of channel parameters for each channel. In some cases, for single-slice excitation (one slice is excited in one excitation), or multi-slice excitation (at least two slices in a slice group are excited simultaneously in one excitation), a single slice or a slice group is excited two or more times using a plurality of channels. In general, only a single setting of the channel parameters of the plurality of channels for the two or more excitations of the single slice or the slice group is performed so that the single slice or the slice group is excited with the same channel parameters in the two or more excitations. If the non-uniformity of the emission field is serious, the single setting of the channel parameters may not meet the requirements for imaging quality. The present disclosure provides some embodiments for setting the channel parameters of the plurality of channels for each excitation of the single slice or the slice group to better reduce emission field unevenness.

In some embodiments, for each of two or more excitations of a single slice or a slice group, the channel parameter corresponding to at least one of a plurality of channels may be determined, so that the channel parameters for different excitations may be different, which refers to multi-mode parameter setting. The channel parameter may include a phase modulation parameter (also referred to as a "phase parameter"), an amplitude modulation parameter (also referred to as an "amplitude parameter"), an excitation power (e.g., an excitation power of a specific channel for exciting the slice), a specific absorption ratio (SAR) (e.g., a SAR when exciting the slice by a specific channel), or the like, or any combination thereof. The setting of the channel parameter of at least one of the plurality of channels for one excitation is referred to as a mode.

For example, for single-slice excitation, slice S1 is excited by channels C1, C2, C3, C4, C5, C6, C7, and C8 for two times. In excitation E1 of slice S1, the channel parameters of channels C1-C8 are set as $P_{11}$, $P_{12}$, $P_{13}$, $P_{14}$, $P_{15}$, $P_{16}$, $P_{17}$, and $P_{18}$, respectively. In excitation E2 of slice S1, the channel parameters of channels C1-C8 are set as $P_{21}$, $P_{22}$, $P_{23}$, $P_{24}$, $P_{25}$, $P_{26}$, $P_{27}$, and $P_{28}$, respectively. As another example, for multi-slice excitation, slices S2 and S3 in a slice group are excited simultaneously by channels C1, C2, C3, C4, C5, C6, C7, and C8 for two times. In excitation E3 of the slice group, the channel parameters of channels C1-C8 are set as $P_{31}$, $P_{32}$, $P_{33}$, $P_{34}$, $P_{35}$, $P_{36}$, $P_{37}$, and $P_{38}$, respectively. In excitation E4 of the slice group, the channel parameters of channels C1-C8 are set as $P_{41}$, $P_{42}$, $P_{43}$, $P_{44}$, $P_{45}$, $P_{46}$, $P_{47}$, and $P_{48}$, respectively.

In some embodiments, the channel parameters of the plurality of channels for each excitation may be determined automatically by the processing device 120 (e.g., according to operation 510 in the process 500, the process 700, the process 800, and the process 900 in the present disclosure), and/or set manually by a user. The processing device 120 may present an interface. The automatically determined channel parameters for each excitation may be presented in the interface. Optionally or additionally, a user may input the channel parameters for each excitation through the interface, or adjust and/or confirm the automatically determined channel parameters through the interface.

Figure 25:
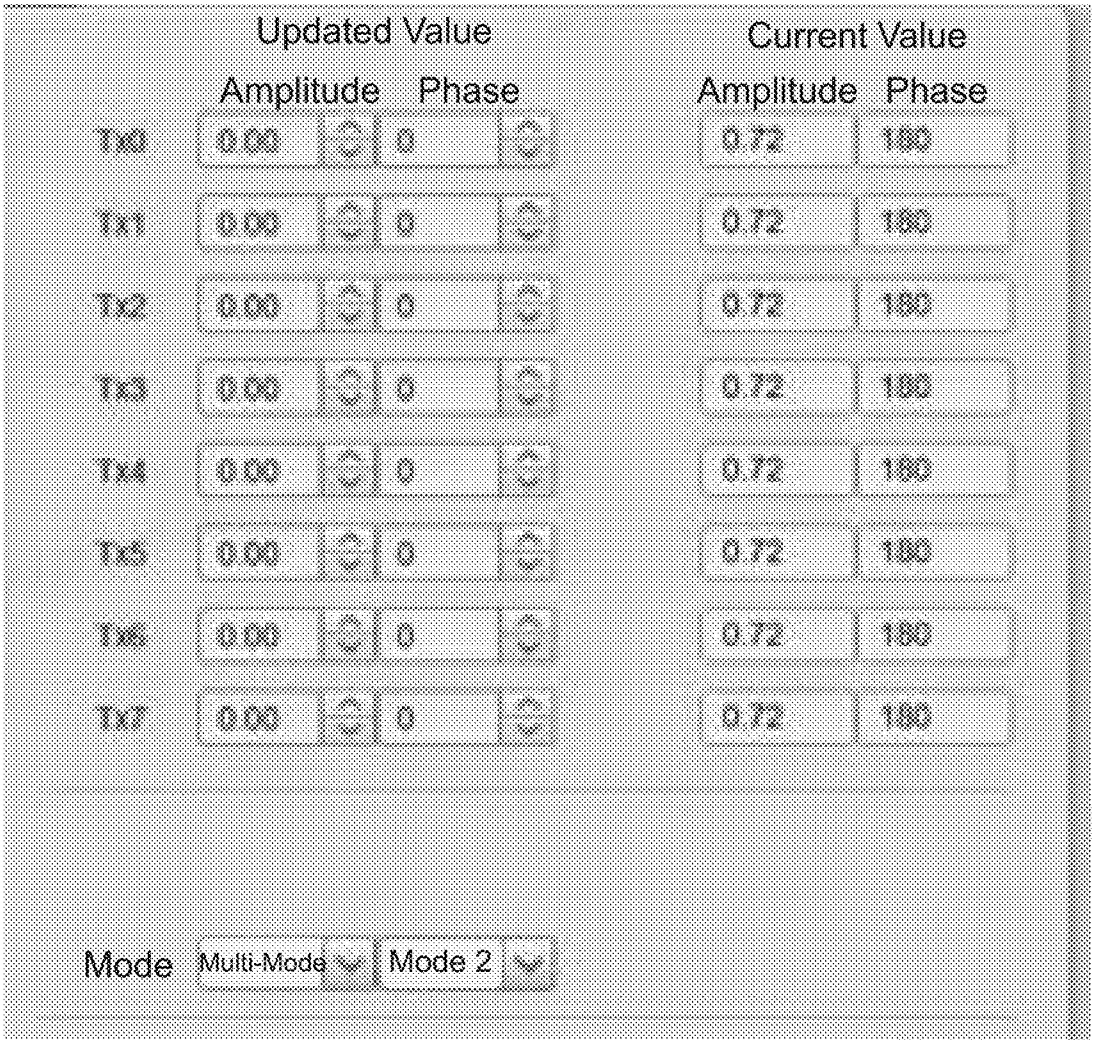
FIG. 25 is a schematic diagram illustrating an exemplary interface for presenting channel parameters of a mode in multi-mode parameter setting according to some embodiments of the present disclosure.

FIG. 25 is a schematic diagram illustrating an exemplary interface for presenting channel parameters of a mode (e.g., mode 2 as shown in FIG. 25) in multi-mode parameter setting according to some embodiments of the present disclosure. As shown in FIG. 25, Tx0-Tx7 refer to 8 channels. The column of "Current Value" includes default values or the automatically determined values of the channel parameters (e.g., including phase and amplitude as shown in FIG. 25) of Tx0-Tx7 for one excitation. The column of "Updated Value" is used for the user to adjust the values in the column of "Current" to generate updated values of the channel parameters of Tx0-Tx7. In some embodiments, the user may directly input the updated values of the channel parameters of at least one of Tx0-Tx7. For example, for channel Tx0, the current values of the amplitude and the phase are 0.72 and 180, respectively. The user may directly input the updated value of the amplitude as 0.82, and input the updated value of the phase as 90. In some embodiments, the user may input a difference value compared to the current value. For example, for channel Tx0, the current values of the amplitude and the phase are 0.72 and 180, respectively. The user may input "+0.1" in the amplitude box corresponding to Tx0 in the column of "Updated Value," and the updated value of the amplitude is determined as 0.82. The user may input "−90" in the phase box corresponding to Tx0 in the column of "Updated Value," and the updated value of the phase is determined as 90. For a channel, if the value of the amplitude (and/or the phase) in the column of "Updated Value" is 0, the value of the amplitude (and/or the phase) of the channel is determined as the corresponding current value.

In some embodiments, in a mode, the channel parameter of at least one of the plurality of channels (e.g., Tx0-Tx7) may be allowed to be adjusted based on the corresponding current value. For different modes, the count and/or the sequence number of the channels of which the channel parameters are allowed to be adjusted based on the corresponding current values may be the same or different. For example, the channel parameters of all of the plurality of channels may always be allowed to be adjusted based on the corresponding current values. As another example, in a mode, the channel parameter of only one channel is allowed to be adjusted based on the corresponding current value.

Merely by way of example, the processing device 120 or the user may select multi-mode parameter setting in the interface. For the first excitation of a single slice or a slice group, the processing device 120 or the user may select "Mode 1" in the interface to set the channel parameters of Tx0-Tx7; For the second excitation of the single slice or the slice group, the processing device 120 or the user may select "Mode 2" in the interface to set the channel parameters of Tx0-Tx7, and so on.

Figure 26:
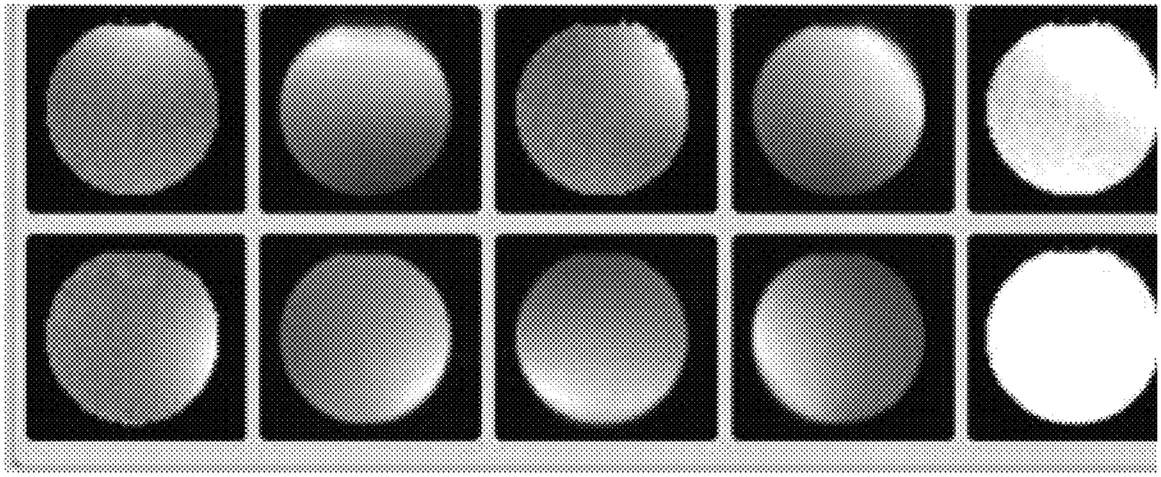
FIG. 26 is a schematic diagram illustrating exemplary actual excitation images each of which corresponds to a channel according to some embodiments of the present disclosure.

In some embodiments, for a mode, in addition to presenting (e.g., displaying) parameter values on the interface as described above, other information related to the channel parameters may be presented on the interface. For example, a waveform corresponding to the at least one channel parameter of each channel may be presented on the interface. As another example, an excitation effect corresponding to the at least one channel parameter of each channel may be presented on the interface. The excitation effect may include at least one of an estimated outline image corresponding to each channel, a combined estimated outline image corresponding to the plurality of channels, an actual excitation image corresponding to each channel, and a combined actual excitation image corresponding to the plurality of channels. The estimated outline image corresponding to a channel refers to an image present an estimated peripheral outline of the excited slice under the at least one channel parameter of the channel. The combined estimated outline image refers to an image present an estimated peripheral outline of the excited slice under the channel parameters of the plurality of channels. The actual excitation image corresponding to a channel is obtained by imaging a slice of a subject (e.g., a water film) under the at least one channel parameter of the channel. FIG. 26 shows 10 actual excitation images each of which corresponding to a channel. The combined actual excitation image is obtained by imaging a slice under the channel parameters of the plurality of channels.

In some embodiments, a user may select a region, as a mask, in the estimated outline image corresponding to each channel, the combined estimated outline image, the actual excitation image corresponding to each channel, or the combined actual excitation image. The mask indicates that it is desirable to improve the image uniformity in the region corresponding to the mask. The processing device 120 or the user may adjust, for the excitation/mode, the channel parameter of at least one of the plurality of channel based on the mask.

In some embodiments, the user may switch to different modes on the interface for viewing, and at least two modes may also be presented at the same time for comparison. For example, the user may switch to different modes on the interface to view the corresponding channel parameter values, waveforms of the channels, and/or excitation effect. As another example, the actual excitation images corresponding to the plurality of channel for Mode 1 and the actual excitation images corresponding to the plurality of channel for Mode 2 may be presented at the same time on the interface for viewing and comparison.

It should be noted that the above description is merely provided for the purposes of illustration, and not intended to limit the scope of the present disclosure. For persons having ordinary skills in the art, multiple variations and modifications may be made under the teachings of the present disclosure. However, those variations and modifications do not depart from the scope of the present disclosure.

Having thus described the basic concepts, it may be rather apparent to those skilled in the art after reading this detailed disclosure that the foregoing detailed disclosure is intended to be presented by way of example only and is not limiting. Various alterations, improvements, and modifications may occur and are intended for those skilled in the art, though not expressly stated herein. These alterations, improvements, and modifications are intended to be suggested by this disclosure, and are within the spirit and scope of the exemplary embodiments of this disclosure.

Moreover, certain terminology has been used to describe embodiments of the present disclosure. For example, the terms "one embodiment," "an embodiment," and "some embodiments" mean that a particular feature, structure or characteristic described in connection with the embodiment is included in at least one embodiment of the present disclosure. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the present disclosure.

Further, it will be appreciated by one skilled in the art, aspects of the present disclosure may be illustrated and described herein in any of a number of patentable classes or context including any new and useful process, machine, manufacture, or composition of matter, or any new and useful improvement thereof. Accordingly, aspects of the present disclosure may be implemented entirely hardware, entirely software (including firmware, resident software, micro-code, etc.) or combining software and hardware implementation that may all generally be referred to herein as a "module," "unit," "component," "device," or "system." Furthermore, aspects of the present disclosure may take the form of a computer program product embodied in one or more computer readable media having computer readable program code embodied thereon.

A computer readable signal medium may include a propagated data signal with computer readable program code embodied therein, for example, in baseband or as part of a carrier wave. Such a propagated signal may take any of a variety of forms, including electro-magnetic, optical, or the like, or any suitable combination thereof. A computer readable signal medium may be any computer readable medium that is not a computer readable storage medium and that may communicate, propagate, or transport a program for use by or in connection with an instruction execution system, apparatus, or device. Program code embodied on a computer readable signal medium may be transmitted using any appropriate medium, including wireless, wireline, optical fiber cable, RF, or the like, or any suitable combination of the foregoing.

Computer program code for carrying out operations for aspects of the present disclosure may be written in any combination of one or more programming languages, including an object oriented programming language such as Java, Scala, Smalltalk, Eiffel, JADE, Emerald, C++, C #, VB. NET, Python or the like, conventional procedural programming languages, such as the "C" programming language, Visual Basic, Fortran 2003, Perl, COBOL 2002, PHP, ABAP, dynamic programming languages such as Python, Ruby and Groovy, or other programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider) or in a cloud computing environment or offered as a service such as a Software as a Service (SaaS).

Furthermore, the recited order of processing elements or sequences, or the use of numbers, letters, or other designations therefore, is not intended to limit the claimed processes and methods to any order except as may be specified in the claims. Although the above disclosure discusses through various examples what is currently considered to be a variety of useful embodiments of the disclosure, it is to be understood that such detail is solely for that purpose, and that the appended claims are not limited to the disclosed embodiments, but, on the contrary, are intended to cover modifications and equivalent arrangements that are within the spirit and scope of the disclosed embodiments. For example, although the implementation of various components described above may be embodied in a hardware device, it may also be implemented as a software only solution, e.g., an installation on an existing server or mobile device.

Similarly, it should be appreciated that in the foregoing description of embodiments of the present disclosure, various features are sometimes grouped together in a single embodiment, figure, or description thereof for the purpose of streamlining the disclosure aiding in the understanding of one or more of the various embodiments. This method of disclosure, however, is not to be interpreted as reflecting an intention that the claimed subject matter requires more features than are expressly recited in each claim. Rather, claim subject matter lie in less than all features of a single foregoing disclosed embodiment.

What is claimed is:

1. A method for controlling magnetic resonance imaging (MRI), implemented on a machine having at least one processing device and at least one storage device, the method comprising:

for each of two or more excitations of a single slice or a slice group of an object, determining a channel parameter corresponding to a plurality of channels, wherein the channel parameters corresponding to at least two of the two or more excitations are different, and the channel parameter includes at least one of a phase modulation parameter, an amplitude modulation parameter, an excitation power, or a specific absorption ratio (SAR); and directing at least a portion of the plurality of channels to excite the single slice or the slice group in the two or more excitations based on the channel parameters.

2. The method of claim 1, wherein determining the channel parameter corresponding to the plurality of channels includes:

obtaining a current value of the channel parameter; and determining an updated value of the channel parameter by modifying the current value of the channel parameter.

3. The method of claim 2, wherein the current value of the channel parameter includes a default value or an automatically determined value of the channel parameter; and the updated value of the channel parameter is determined by modifying the current value of the channel parameter by a user.

4. The method of claim 2, wherein the channel parameter includes a plurality of parameters each of which corresponds to one of the plurality of channels; and for each of the two or more excitations, at least one of the plurality of parameters is allowed to be modified based on the current value.

5. The method of claim 1, further comprising:

for each of the two or more excitations, causing a setting of the channel parameter of the plurality of channels for the excitation to be presented on an interface.

6. The method of claim 5, wherein for each of the two or more excitations, causing the setting of the channel parameter of the plurality of channels for the excitation to be presented on the interface includes:

causing the channel parameters corresponding to the two or more excitations to be presented on an interface.

7. The method of claim 5, wherein for each of the two or more excitations, causing the setting of the channel parameter of the plurality of channels for the excitation to be presented on the interface includes:

causing waveforms of the channel parameters corresponding to the two or more excitations to be presented on the interface.

8. The method of claim 5, wherein for each of the two or more excitations, causing the setting of the channel parameter of the plurality of channels for the excitation to be presented on the interface includes:

causing an excitation effect of the channel parameters corresponding to the two or more excitations to be presented on the interface.

9. The method of claim 8, wherein the excitation effect includes at least one of:

a plurality of estimated outline images each of which corresponds to one of the plurality of channels, a combined estimated outline image corresponding to the plurality of channels, a plurality of actual excitation images each of which corresponds to one of the plurality of channels, or a combined actual excitation image corresponding to the plurality of channels.

10. The method of claim 8, further comprising:

determining a region, as a mask, in the excitation effect, wherein the mask indicates that it is desirable to improve image uniformity in the region corresponding to the mask; and adjusting the channel parameter of the plurality of channels based on the mask.

11. The method of claim 5, further comprising:

causing the setting of the channel parameter of the plurality of channels for at least two of the two or more excitations to be presented on the interface at the same time.

12. The method of claim 1, wherein the channel parameter corresponding to the plurality of channels includes a plurality of parameters each of which corresponds to one of the plurality of channels; and for each of at least one of the plurality of parameters, values of the parameter for the at least two of the two or more excitations are different.

13. A method for controlling magnetic resonance imaging (MRI), implemented on a machine having at least one processing device and at least one storage device, the method comprising:

for each slice of a plurality of slices of a subject to be scanned, determining a plurality of radiofrequency (RF) parameters, the plurality of RF parameters including at least one channel parameter corresponding to each of a plurality of channels, the at least one channel parameter corresponding to each of the plurality of channels including an excitation power of the channel for exciting the slice;

selecting a slice to be excited from the plurality of slices;

determining a first total excitation power of the plurality of channels for exciting the selected slice;

in response to determining that the first total excitation power exceeds a total power threshold, determining at least one candidate slice based on the excitation power of each channel of the plurality of channels for exciting each slice of the plurality of slices;

determining a slice group based on the selected slice and the at least one candidate slice, the slice group including at least two slices selected from the plurality of slices; and directing at least a portion of the plurality of channels to excite the slice group based on RF parameters corresponding to the slice group.

14. The method of claim 13, wherein the at least one channel parameter corresponding to each of the plurality of channels includes a specific absorption ratio (SAR) when exciting the slice; and determining the slice group based at least in part on the RF parameters corresponding to the plurality of slices includes:

determining the slice group based at least in part on the SARs corresponding to the plurality of channels for exciting the plurality of slices.

15. A method for controlling magnetic resonance imaging (MRI), implemented on a machine having at least one processing device and at least one storage device, the method comprising:

for each slice of a plurality of slices of a subject to be scanned, determining a plurality of radiofrequency (RF) parameters, the plurality of RF parameters including at least one channel parameter corresponding to each of a plurality of channels;

determining a slice group based at least in part on the RF parameters corresponding to the plurality of slices, the slice group including at least two slices selected from the plurality of slices;

directing at least a portion of the plurality of channels to excite the slice group based on RF parameters corresponding to the slice group; and directing a terminal device to present output data related to at least a part of the channel parameters corresponding to the plurality of channels.

16. The method of claim 15, wherein the directing a terminal device to present output data related to at least a part of the channel parameters corresponding to the plurality of channels includes:

for two or more of the plurality of channels, directing the terminal device to concurrently present output data related to corresponding channel parameters.

17. The method of claim 15, wherein the directing the terminal device to present output data related to at least a part of the channel parameters includes:

directing the terminal device to present one or more marks and output data related to at least one channel parameter corresponding to one of the plurality of channels, wherein the one or more marks are used to provide an unfold option for presenting output data related to at least one channel parameter corresponding to at least one of other channels.

18. The method of claim 15, further comprising:

in response to receiving an export request for exporting at least one channel parameter corresponding to at least one of the plurality of channels via the terminal device, exporting the corresponding at least one channel parameter based on the export request.

19. The method of claim 15, further comprising:

in response to receiving an update request for updating one or more of the channel parameters corresponding to the plurality of channels via the terminal device, updating the one or more channel parameters based on the update request.

20. The method of claim 15, further comprising:

verifying one or more of the channel parameters corresponding to the plurality of channels based on one or more reference datasets.

* * * * *